US009330903B2

(12) United States Patent  
Sano et al.

(10) Patent No.: US 9,330,903 B2  
(45) Date of Patent: May 3, 2016

(54) METHOD OF MANUFACTURING SEMICONDUCTOR DEVICE, SUBSTRATE PROCESSING APPARATUS AND NON-TRANSITORY COMPUTER-READABLE RECORDING MEDIUM

(71) Applicant: Hitachi Kokusai Electric Inc., Tokyo (JP)

(72) Inventors: Atsushi Sano, Toyama (JP); Yoshiro Hirose, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/677,199

(22) Filed: Apr. 2, 2015

(65) Prior Publication Data

US 2015/0287588 A1 Oct. 8, 2015

(30) Foreign Application Priority Data

Apr. 2, 2014 (JP) .................................. 2014-076093

(51) Int. Cl.
*H01L 21/02* (2006.01)
*C23C 16/36* (2006.01)
*C23C 16/455* (2006.01)

(52) U.S. Cl.
CPC .............. *H01L 21/022* (2013.01); *C23C 16/36* (2013.01); *C23C 16/45529* (2013.01); *C23C 16/45542* (2013.01); *C23C 16/45546* (2013.01); *H01L 21/0228* (2013.01); *H01L 21/02112* (2013.01)

(58) Field of Classification Search
None
See application file for complete search history.

(56) References Cited

U.S. PATENT DOCUMENTS

2010/0098884 A1 4/2010 Balseanu et al.
2015/0187559 A1* 7/2015 Sano ..................... H01L 21/022
  438/763
2015/0200085 A1* 7/2015 Sano ..................... H01L 21/022
  438/763

FOREIGN PATENT DOCUMENTS

JP   2004-136661 A    5/2004
JP   2011-166060 A    8/2011
JP   2012-531045 A   12/2012

* cited by examiner

*Primary Examiner* — Seahvosh Nikmanesh
(74) *Attorney, Agent, or Firm* — Volpe and Koenig, P.C.

(57) ABSTRACT

Provided a method including forming a laminated film where a first film and a second film are laminated on a substrate by performing a cycle a predetermined number of times under a condition where a borazine ring structure in a fourth process gas is maintained. The cycle includes: (a) forming the first film by performing a first set a predetermined number of times, wherein the first set includes supplying a first process gas and supplying a second process gas to the substrate; and (b) forming the second film by performing a second set a predetermined number of times, wherein the second set includes supplying a third process gas and supplying the fourth process gas to the substrate.

13 Claims, 11 Drawing Sheets

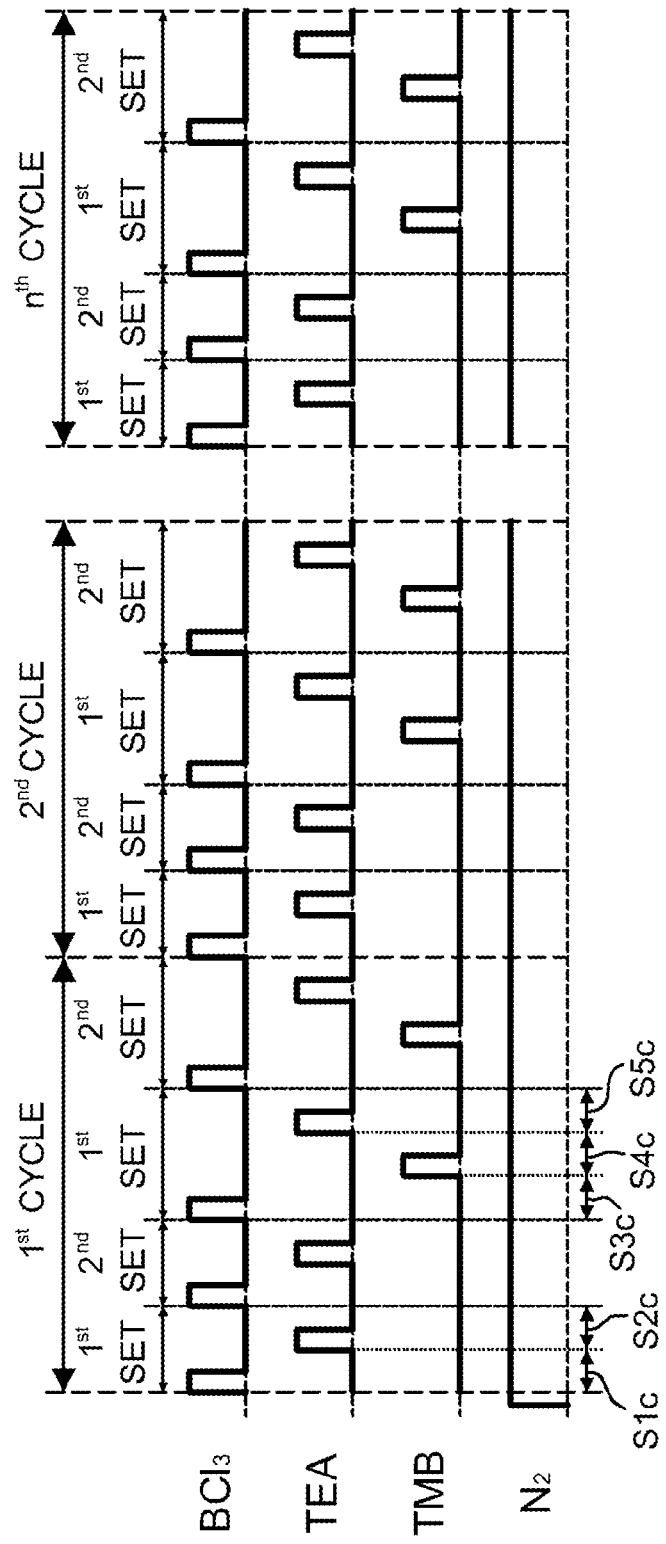

METHOD OF MANUFACTURING SEMICONDUCTOR DEVICE, SUBSTRATE PROCESSING APPARATUS AND NON-TRANSITORY COMPUTER-READABLE RECORDING MEDIUM

CROSS-REFERENCE TO RELATED PATENT APPLICATION

This non-provisional U.S. patent application claims priority under 35 U.S.C. §119 of Japanese Patent Application No. 2014-076093, filed on Apr. 2, 2014, the entire contents of which are hereby incorporated by reference.

BACKGROUND OF THE INVENTION

1. Field of the Invention

The present invention relates to a method of manufacturing a semiconductor device that includes a process of forming a thin film on a substrate, a substrate processing apparatus and a non-transitory computer-readable recording medium.

2. Description of the Related Art

Among processes of manufacturing a semiconductor apparatus (semiconductor device), a process of forming a boron nitride film (BN film) on a substrate such as a silicon wafer may be performed. Also, it is known that a hydrogen fluoride (HF) resistance of a film may increase when carbon (C) is contained in the BN film.

RELATED ART DOCUMENT

Patent Document

1. Japanese Laid-open Patent Application No. 2011-166060

SUMMARY OF THE INVENTION

As a technique for forming a BN film, a technique for separately supplying a gas containing boron (B) and a gas containing nitrogen (N) onto a substrate has been known. Also, as a technique for forming a borocarbonitride film (BCN film) that is obtained by adding carbon into a BN film, a technique for separately supplying a gas containing boron, a gas containing carbon and a gas containing nitrogen onto a substrate has been known.

However, the BCN film or the BN film formed by the technique may have a low oxidation resistance. Also, although such techniques are capable of decreasing a dielectric constant of the film to some extent, it is necessary to further decrease the dielectric constant.

The present invention is provided to form a thin film having a high oxidation resistance and a low dielectric constant.

According to an aspect of the present invention, there is provided a technique of manufacturing a semiconductor device, including forming a laminated film where a first film and a second film are laminated on a substrate by performing a cycle a predetermined number of times under a condition where a borazine ring structure in a fourth process gas is maintained, the cycle including:

(a) forming a film free of the borazine ring structure and including boron and nitrogen or a film free of the borazine ring structure and including boron, carbon and nitrogen as the first film by performing a first set a predetermined number of times, wherein the first set includes: supplying a first process gas free of the borazine ring structure and including boron to the substrate and supplying a second process gas including nitrogen or including nitrogen and carbon to the substrate; and (b) forming a film having the borazine ring structure and including boron and nitrogen or a film having the borazine ring structure and including boron, carbon and nitrogen as the second film by performing a second set a predetermined number of times, wherein the second set includes: supplying a third process gas to the substrate and supplying the fourth process gas having the borazine ring structure and an organic ligand to the substrate.

BRIEF DESCRIPTION OF THE DRAWINGS

FIG. 5A is a diagram illustrating an exemplary sequence in which film formation is performed in a non plasma state. FIG. 5B is a diagram illustrating an exemplary sequence in which film formation is performed using plasma.

FIG. 6 is a diagram illustrating a gas supply timing in a film formation sequence of a third embodiment.

FIG. 7A is a diagram illustrating an exemplary sequence in which film formation is performed in a non plasma state. FIG. 7B is a diagram illustrating an exemplary sequence in which film formation is performed using plasma.

FIG. 8A is a diagram illustrating an exemplary sequence in which film formation is performed in a non plasma state. FIG. 8B is a diagram illustrating an exemplary sequence in which film formation is performed using plasma.

DETAILED DESCRIPTION OF THE PREFERRED EMBODIMENTS

<First Embodiment of the Present Invention>

Hereinafter, the first embodiment of the present invention will be described with reference to FIGS. 1 and 3.

(1) Configuration of Substrate Processing Apparatus

Figure 1:
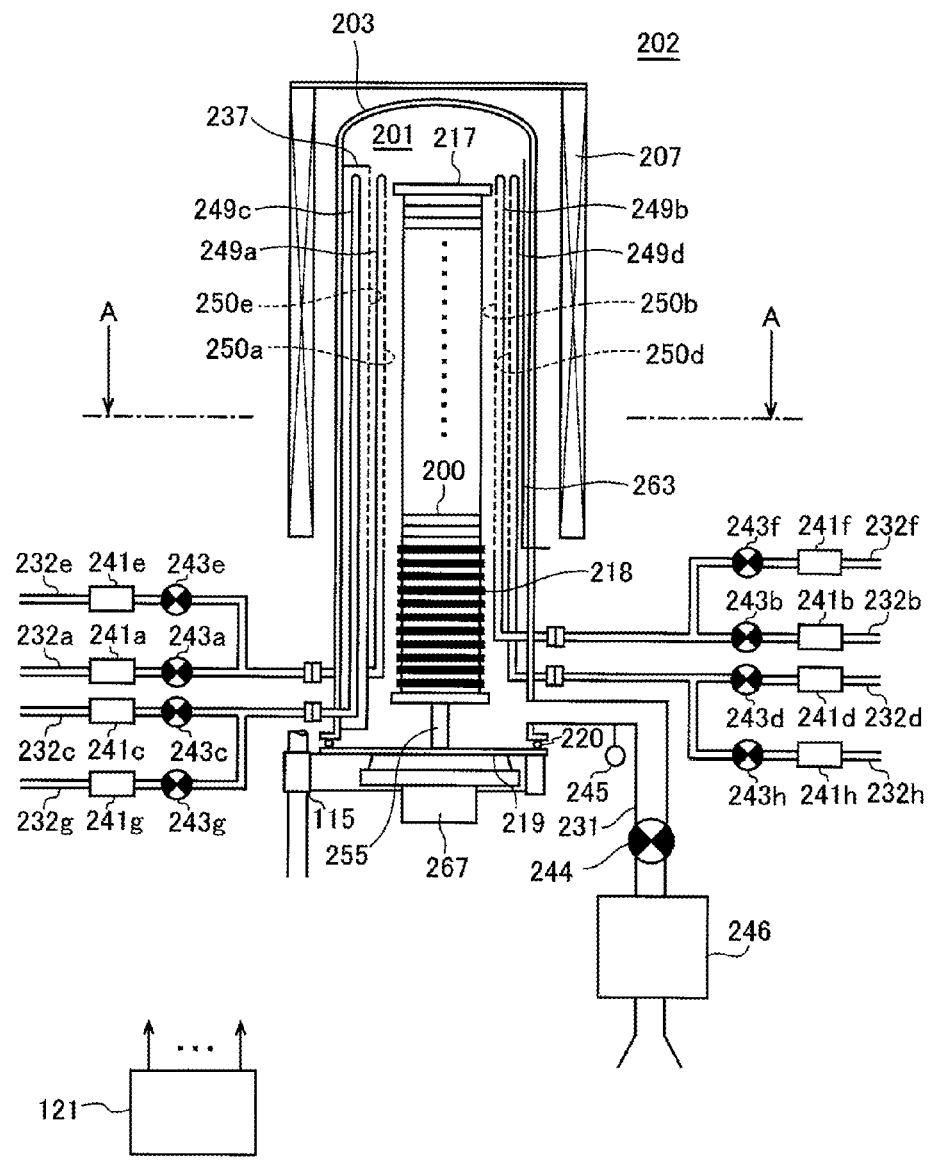
FIG. 1 is a diagram schematically illustrating a configuration of a vertical processing furnace of a substrate processing apparatus preferably used in embodiments of the present invention and is a vertical cross-sectional view of a processing furnace portion.

As illustrated in FIG. 1, a processing furnace 202 includes a heater 207 serving as a heating unit (heating mechanism). The heater 207 has a cylindrical shape and is vertically provided with support from a heater base (not illustrated) serving as a holding plate. As will be described below, the heater 207 also serves as an activating device (exciting unit) for activating (exciting) a gas by heat.

In the heater 207, a reaction tube 203 forming a reaction container (process container) is concentrically provided with respect to the heater 207. The reaction tube 203 is made of a heat-resistant material such as quartz ($SiO_2$) or silicon carbide (SiC), and is formed in a cylindrical shape whose upper end is closed and lower end is opened. A process chamber 201 is formed in a cylindrical hollow portion of the reaction tube 203 and is configured such that wafers 200 may be accommodated as substrates in a horizontal orientation to be arranged on multiple stages in a vertical direction by a boat 217 to be described below.

Nozzles 249a to 249d are provided in the process chamber 201 to penetrate a lower part of the reaction tube 203. Gas supply pipes 232a to 232d are connected to the nozzles 249a to 249d, respectively. In this manner, the four nozzles 249a to 249d and the four gas supply pipes 232a to 232d are provided in the reaction tube 203 to supply a plurality of types, here four types, of gases into the process chamber 201.

However, the processing furnace 202 according to this embodiment is not limited to the above-described form. For example, a manifold made of a metal may be provided below the reaction tube 203 to support the reaction tube 203, and each nozzle may be provided to penetrate sidewalls of the manifold. In this case, an exhaust pipe 231 (to be described below) may be further provided in the manifold. In this case, the exhaust pipe 231 may also be provided below the reaction tube 203 rather than in the manifold. A furnace port portion of the processing furnace 202 may be made of a metal, and the nozzle and the like may be provided at the furnace port portion made of a metal.

In the gas supply pipes 232a to 232d, in order from an upstream end, mass flow control units (MFCs) 241a to 241d serving as flow rate controllers (flow rate control units) and valves 243a to 243d serving as on-off valves are provided, respectively. Gas supply pipes 232e to 232h configured to supply an inert gas are connected downstream from the valves 243a to 243d of the gas supply pipes 232a to 232d, respectively. In the gas supply pipes 232e to 232h, in order from an upstream end, MFCs 241e to 241h serving as flow rate controllers (flow rate control units) and valves 243e to 243h serving as on-off valves are provided, respectively.

Figure 2:
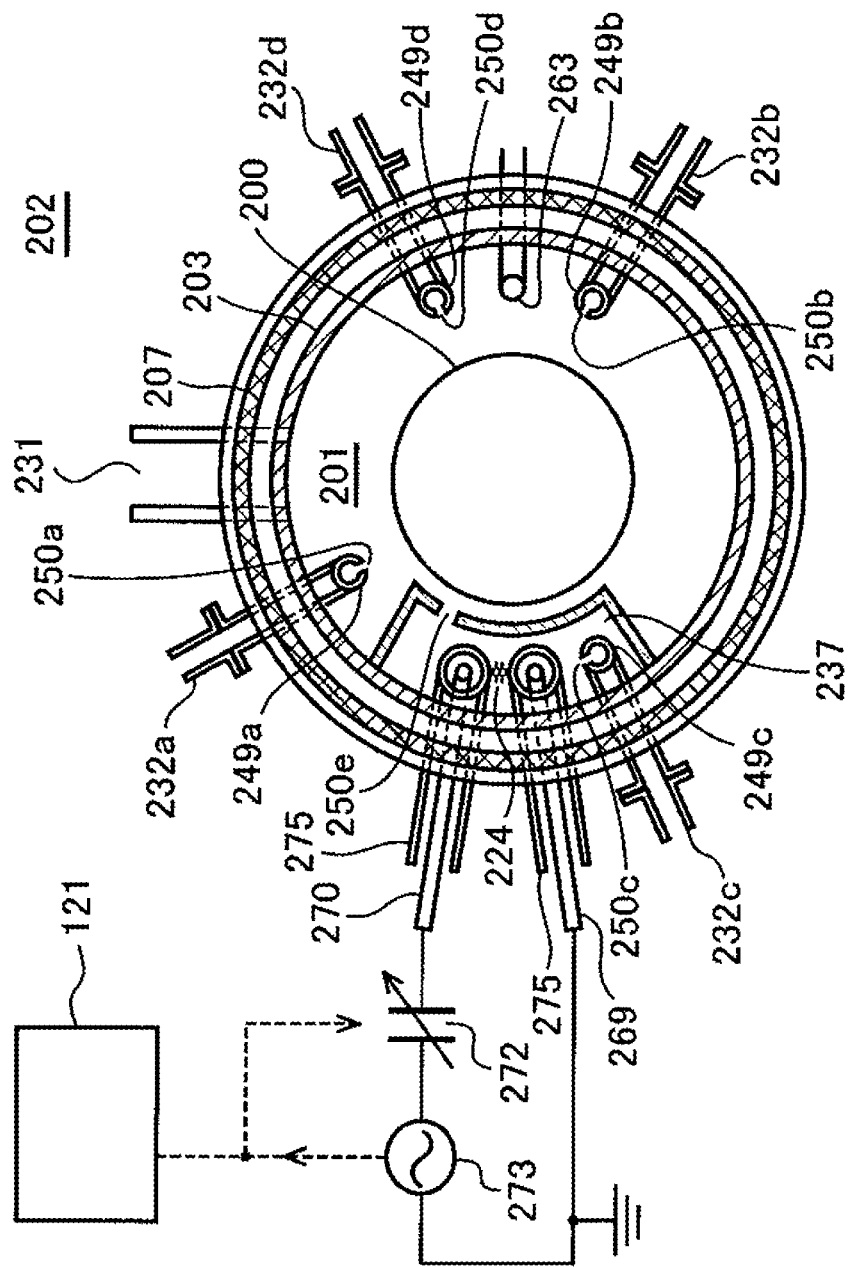
FIG. 2 is a diagram schematically illustrating a configuration of a vertical processing furnace of a substrate processing apparatus preferably used in embodiments of the present invention and is a cross-sectional view of a processing furnace portion taken along line A-A in FIG. 1.

The nozzles 249a, 249b and 249d are connected to leading ends of the gas supply pipes 232a, 232b and 232d. As illustrated in FIG. 2, the nozzles 249a, 249b and 249d are provided in a cylindrical space between an inner wall of the reaction tube 203 and the wafer 200, from a lower inner wall to an upper inner wall of the reaction tube 203, so as to rise in a direction in which the wafers 200 are stacked. In other words, the nozzles 249a, 249b and 249d are provided along a wafer arrangement region in which the wafers 200 are arranged, in a region that horizontally surrounds the wafer arrangement region at sides of the wafer arrangement region. The nozzles 249a, 249b and 249d are configured as L-shaped long nozzles, and include horizontal portions provided to penetrate lower sidewalls of the reaction tube 203 and vertical portions provided to rise at least from one end to the other end of the wafer arrangement region. Gas supply holes 250a, 250b, and 250d configured to supply reactive gases are provided at side surfaces of the nozzles 249a, 249b, and 249d. The gas supply holes 250a, 250b, and 250d may be opened to the center of the reaction tube 203 to supply gases to the wafer 200. The plurality of gas supply holes 250a, 250b, and 250d are provided from a lower part to an upper part of the reaction tube 203, and are provided to each have the same opening area at the same opening pitch.

The nozzle 249c is connected to a leading end of the gas supply pipe 232c. The nozzle 249c is provided in a buffer chamber 237 that is a gas dispersion space. As illustrated in FIG. 2, the buffer chamber 237 is a cylindrical space between the inner wall of the reaction tube 203 and the wafer 200 and is provided in a part from the lower inner wall to the upper inner wall of the reaction tube 203 in a direction in which the wafers 200 are stacked. That is, the buffer chamber 237 is provided along the wafer arrangement region in a region that horizontally surrounds the wafer arrangement region at sides of the wafer arrangement region. In the buffer chamber 237, gas supply holes 250e configured to supply a gas are provided at an end of a wall adjacent to the wafer 200. The gas supply holes 250e may be opened to the center of the reaction tube 203 to supply a gas to the wafer 200. The plurality of gas supply holes 250e are provided from the lower part to the upper part of the reaction tube 203, and are provided to each have the same opening area at the same opening pitch.

The nozzle 249c is provided at an end opposite to an end at which the gas supply hole 250e of the buffer chamber 237 is provided, from the lower inner wall to the upper inner wall of the reaction tube 203, so as to rise in the direction in which the wafers 200 are stacked. In other words, the nozzle 249c is provided along the wafer arrangement region in which the wafers 200 are arranged, in a region that horizontally surrounds the wafer arrangement region at sides of the wafer arrangement region. The nozzle 249c is configured as the L-shaped long nozzle, and includes a horizontal portion provided to penetrate lower sidewalls of the reaction tube 203 and a vertical portion provided to rise at least from one end to the other end of the wafer arrangement region. A gas supply hole 250c configured to supply a gas is provided at a side surface of the nozzle 249c. The gas supply hole 250c is opened to the center of the buffer chamber 237. Similar to the gas supply hole 250e, a plurality of the gas supply holes 250c are provided from the lower part to the upper part of the reaction tube 203. When a difference between pressures in the buffer chamber 237 and the process chamber 201 is small, the plurality of gas supply holes 250e may be formed to each have the same opening area at the same opening pitch from an upstream end (lower part) to a downstream end (upper part). On the other hand, when a difference between pressures in the buffer chamber 237 and the process chamber 201 is large, the opening areas of the gas supply holes 250e may gradually increase from the upstream end to the downstream end or the opening pitch between the gas supply holes 250e may gradually decrease from the upstream end to the downstream end.

By adjusting the opening area or the opening pitch of the gas supply hole 250c from the upstream end to the downstream end as described above, it is possible to spray gases at different flow velocities but substantially the same flow rate from each of the gas supply holes 250c. Then, when the gases sprayed from each of the plurality of gas supply holes 250c are introduced into the buffer chamber 237, different flow velocities of the gases may be uniformized in the buffer chamber 237. When the gases are sprayed into the buffer chamber 237 from the plurality of gas supply holes 250c, speeds of particles of each gas are reduced in the buffer chamber 237, and then the gases are sprayed into the process chamber 201 through the plurality of gas supply holes 250e. When the gases sprayed into the buffer chamber 237 from each of the plurality of gas supply holes 250c are sprayed into the process chamber 201 through each of the gas supply holes 250e, the gases each have a uniform flow rate and flow velocity.

In this way, in this embodiment, the gas is transferred through a longitudinally extending space having a cylindrical shape defined by the inner wall of the reaction tube 203 and ends (outer circumferences) of the plurality of stacked wafers 200, that is, through the buffer chamber 237 and the nozzles 249a to 249d disposed in the cylindrical space. Then, through the gas supply holes 250a to 250e that are opened to the nozzles 249a to 249d and the buffer chamber 237, respectively, the gas is initially sprayed into the reaction tube 203 in the vicinity of the wafer 200. A main flow of the gas in the reaction tube 203 is set to be parallel to a surface of the wafer 200, that is, horizontal. In such a configuration, it is possible to uniformly supply the gas to each of the wafers 200, thereby uniformizing a film thickness of a thin film to be formed on each of the wafers 200. The gas flowing along a surface of the wafer 200, that is, a residual gas after a reaction, flows toward an exhaust port, that is, toward the exhaust pipe 231 to be described below. However, a flow direction of the residual gas may be appropriately defined by a location of the exhaust port and is not limited to the vertical direction.

Through the gas supply pipe 232a, as a first process gas free of a borazine ring structure and including boron, a source gas containing boron and a halogen element, for example, a chloroborane-based source gas serving as a source gas containing at least boron and chlorine (Cl) is supplied into the process chamber 201 through the MFC 241a, the valve 243a, the nozzle 249a. The chloroborane-based source gas also serves as a third process gas.

The chloroborane-based source gas refers to a chloroborane-based source in a gas state, for example, a gas that is obtained by vaporizing a chloroborane-based source in a liquid state under room temperature and normal pressure, a chloroborane-based source in a gas state under room temperature and normal pressure or the like. The chloroborane-based source is a borane-based source that includes a chloro group as a halogen group and is a source that includes at least boron and chlorine. The chloroborane-based source may be a type of halide. The borane-based source is not limited to a source that includes borane (borohydride) such as monoborane ($BH_3$) or diborane ($B_2H_6$) but is a general term for a source that includes a borane compound (borane derivative) in which hydrogen of the borane is replaced with another element or the like. When the term "source" is used in this specification, it may refer to either or both of "a liquid source in a liquid state" or "a source gas in a gas state." When the term "chloroborane-based source" is used in this specification, it may refer to either or both of "a chloroborane-based source in a liquid state" or "a chloroborane-based source gas in a gas state." As the chloroborane-based source, for example, trichloroborane (BCl) may be used. Since $BCl_3$ is in a gas state under room temperature and normal pressure, it may be supplied as a source gas ($BCl_3$ gas) without being vaporized by a vaporization system such as a vaporizer or a bubbler. On the other hand, when a liquid source in a liquid state under room temperature and normal pressure is used, the liquid source is vaporized by a vaporization system such as a vaporizer or a bubbler and then is supplied as the source gas.

Through the gas supply pipe 232b, as a second process gas containing nitrogen and carbon, a reactive gas formed of the three elements carbon, nitrogen and hydrogen (H), for example, a gas containing an amine, that is, an amine-based gas is supplied into the process chamber 201 through the MFC 241b, the valve 243b and the nozzle 249b. The amine-based gas also serves as the third process gas.

The amine-based gas refers to an amine in a gas state, for example, a gas that is obtained by vaporizing amine in a liquid state under room temperature and normal pressure or a gas including an amine group such as an amine in a gas state under room temperature and normal pressure. The amine-based gas includes an amine such as ethylamine, methylamine, propylamine, isopropylamine, butylamine, and isobutylamine. "Amine" is a general term for a compound in which hydrogen of ammonia ($NH_3$) is replaced with a hydrocarbon group such as an alkyl group. An amine includes a hydrocarbon group such as an alkyl group as a ligand containing carbon atoms, that is, an organic ligand. Since the amine-based gas includes the three elements carbon, nitrogen and hydrogen without boron, it may be called a boron-free gas. Since the amine-based gas does not include boron or a metal, it may also be called a boron-free and metal-free gas. The amine-based gas is a nitrogen-containing gas (nitrogen source), a carbon-containing gas (carbon source) and a hydrogen-containing gas. The amine-based gas may be a material formed of only the three elements carbon, nitrogen and hydrogen that form an amine group. When the term "amine" is used in this specification, it may refer to either or both of "an amine in a liquid state" or "an amine-based gas in a gas state." As the amine-based gas, for example, triethylamine $[(C_2H_5)_3N$, abbreviation: TEA] gas that includes three ligands (ethyl groups) containing carbon atoms in its composition formula (in a molecule) and includes a greater number of carbon atoms than nitrogen atoms in its composition formula may be used. When an amine in a liquid state under room temperature and normal pressure such as TEA is used, the amine in a liquid state is vaporized by a vaporization system such as a vaporizer or a bubbler and then is supplied as a reactive gas (TEA gas).

Through the gas supply pipe 232c, as a second process gas containing nitrogen, a nitriding gas (nitrogen-containing gas) is supplied into the process chamber 201 with the MFC 241c, the valve 243c, the nozzle 249c and the buffer chamber 237 therebetween. The nitriding gas also serves as the third process gas. As the nitriding gas, for example, ammonia ($NH_3$) gas may be used.

Through the gas supply pipe 232d, as a fourth process gas containing borazine and an organic ligand, a reactive gas including a borazine compound, for example, a reactive gas including an alkylborazine compound serving as an organic borazine compound, that is, an organic borazine-based gas (borazine-based gas), is supplied into the process chamber 201 through the MFC 241d, the valve 243d and the nozzle 249d.

Here, borazine is a heterocyclic compound formed of boron (B), nitrogen (N) and hydrogen (H) and may be represented by the composition formula $B_3H_6N_3$. The borazine compound is a compound having a borazine ring structure (also called a borazine structure) forming a borazine ring of three boron atoms and three nitrogen atoms. The organic borazine compound is a borazine compound containing carbon (C) and may also be called a borazine compound including a carbon-containing ligand. The alkylborazine compound, which is a borazine compound including an alkyl group, may also be a borazine compound including an alkyl group as a ligand. In the alkylborazine compound, at least one of six hydrogen atoms included in borazine is replaced with a hydrocarbon containing at least one carbon atom. The alkylborazine compound may be a material that includes a borazine ring structure forming a borazine ring and contains boron, nitrogen, hydrogen and carbon. Also, the alkylborazine compound may be a material that includes a borazine ring structure and an alkyl ligand. A reactive gas including the organic borazine compound is a boron-containing gas (boron source), a nitrogen-containing gas (nitrogen source) and a carbon-containing gas (carbon source).

As a reactive gas including the borazine compound, for example, n,n',n''-trimethylborazine (abbreviation: TMB) gas may be used. TMB may also be a borazine compound that includes a borazine ring structure and includes a methyl group as a ligand. Also, when a borazine compound in a liquid state under room temperature and normal pressure such as TMB is used, the borazine compound in a liquid state is vaporized by a vaporization system such as a vaporizer or a bubbler and then is supplied as a reactive gas (TMB gas) including the borazine compound. Also, the reactive gas including the borazine compound is simply called a borazine compound gas.

Through the gas supply pipes 232e to 232h, as the inert gas, for example, nitrogen ($N_2$) gas, is supplied into the process chamber 201 with the MFCs 241e to 241h, the valves 243e to 243h, the gas supply pipes 232a to 232d, the nozzles 249a to 249d and the buffer chamber 237 therebetween.

When the above gas flows through each of the gas supply pipes, the gas supply pipe 232a, the MFC 241a and the valve 243a mainly constitute a source gas supply system configured to supply a source gas containing boron and a halogen element, that is, a chloroborane-based source gas supply system. The nozzle 249a may also be included in the chloroborane-based source gas supply system. The source gas supply system may also be called a source supply system, and the chloroborane-based source gas supply system may also be called a chloroborane-based source supply system.

Also, the gas supply pipe 232b, the MFC 241b and the valve 243b mainly constitute a supply system of a reactive gas formed of the three elements carbon, nitrogen and H, that is, an amine-based gas supply system. The nozzle 249b may also be included in the amine-based gas supply system. The amine-based gas supply system may also be simply called an amine supply system.

Also, the gas supply pipe 232c, the MFC 241c and the valve 243c mainly constitute a nitriding gas (nitrogen-containing gas) supply system. The nozzle 249c and the buffer chamber 237 may also be included in the nitriding gas supply system.

Also, the gas supply pipe 232d, the MFC 241d and the valve 243d mainly constitute an organic borazine-based gas supply system serving as the supply system of the reactive gas containing the borazine compound. The nozzle 249d may also be included in the organic borazine-based gas supply system. Also, the organic borazine-based gas supply system may also be called a borazine compound gas supply system.

Also, the gas supply pipes 232e to 232h, the MFCs 241e to 241h and the valves 243e to 243h mainly constitute an inert gas supply system. The nozzles 249a to 249d and the buffer chamber 237 may also be included in the inert gas supply system downstream from a portion connecting the gas supply pipes 232e to 232h of the gas supply pipes 232a to 232d. The inert gas supply system also serves as a purge gas supply system.

Also, the chloroborane-based source gas supply system, the amine-based gas supply system, the nitriding gas supply system, the organic borazine-based gas supply system and the inert gas supply system constitute a gas supply system.

As illustrated in FIG. 2, in the buffer chamber 237, two rod-shaped electrodes 269 and 270 made of a conductor and having an elongated structure are provided from the lower part to the upper part of the reaction tube 203 in the direction in which the wafers 200 are stacked. Each of the rod-shaped electrodes 269 and 270 is provided in parallel to the nozzle 249c. Each of the rod-shaped electrodes 269 and 270 is protected by being covered with an electrode protecting pipe 275 from an upper part to a lower part. One of the rod-shaped electrodes 269 and 270 is connected to a high frequency power source 273 through a matching unit 272, and the other thereof is connected to a ground serving as a reference potential. When high frequency power is applied between the rod-shaped electrodes 269 and 270 from the high frequency power source 273 through the matching unit 272, plasma is generated in a plasma generation region 224 between the rod-shaped electrodes 269 and 270. The rod-shaped electrodes 269 and 270 and the electrode protecting pipe 275 mainly constitute a plasma source serving as a plasma generator (plasma generating unit). The matching unit 272 and the high frequency power source 273 may be included in the plasma source. As will be described below, the plasma source serves as an activating mechanism (exciting unit) for activating a gas to a plasma state.

The electrode protecting pipe 275 has a structure in which each of the rod-shaped electrodes 269 and 270 may be inserted into the buffer chamber 237 while the electrodes are isolated from an atmosphere in the buffer chamber 237. When a concentration of oxygen in the electrode protecting pipe 275 is substantially the same as a concentration of oxygen in the external air (atmosphere), the rod-shaped electrodes 269 and 270 inserted into the electrode protecting pipe 275 are oxidized by heat from the heater 207. When the inert gas such as $N_2$ gas is filled in the electrode protecting pipe 275, or when an inside of the electrode protecting pipe 275 is purged with the inert gas such as $N_2$ gas using an inert gas purge mechanism, a concentration of oxygen in the electrode protecting pipe 275 decreases, thereby preventing the rod-shaped electrodes 269 and 270 from being oxidized.

The exhaust pipe 231 configured to exhaust an atmosphere in the process chamber 201 is provided in the reaction tube 203. In the exhaust pipe 231, a vacuum pump 246 serving as a vacuum exhaust device is connected to a pressure sensor 245 serving as a pressure detector (pressure detecting unit) configured to detect a pressure in the process chamber 201 through an auto pressure controller (APC) valve 244 serving as a pressure regulator (pressure regulating unit). The APC valve 244 is a valve that may perform vacuum-exhaust and vacuum-exhaust stop processes in the process chamber 201 by opening or closing the valve while the vacuum pump 246 is operated, and regulate a pressure in the process chamber 201 by adjusting a degree of valve opening based on information on pressure detected by the pressure sensor 245 while the vacuum pump 246 is operated. The exhaust pipe 231, the APC valve 244, and the pressure sensor 245 mainly constitute an exhaust system. The vacuum pump 246 may be included in the exhaust system.

Below the reaction tube 203, a seal cap 219 capable of hermitically sealing a lower opening of the reaction tube 203 is provided as a furnace port cover. The seal cap 219 is configured to abut a lower end of the reaction tube 203 in a vertical direction from a lower part thereof. The seal cap 219 is made of a metal such as stainless steel and has a disk shape. An 0 ring 220 is provided as a seal member that abuts the lower end of the reaction tube 203 on an upper surface of the seal cap 219. A rotating mechanism 267 configured to rotate the boat 217, to be described below, is provided at a side of the seal cap 219 opposite to the process chamber 201. A rotary shaft 255 of the rotating mechanism 267 penetrates the seal cap 219 and is connected to the boat 217. The rotating mechanism 267 is configured to rotate the wafer 200 by rotating the boat 217. The seal cap 219 is configured to be vertically moved upward and downward by a boat elevator 115 serving as a lifting mechanism that is vertically provided at the outside of the reaction tube 203. The boat elevator 115 is configured to load or unload the boat 217 into or from the process chamber 201 by moving the seal cap 219 upward and downward. The boat elevator 115 is configured as a transfer device (transfer mechanism) that transfers the boat 217, that is, the wafer 200, into or out of the process chamber 201.

The boat 217 serving as a substrate support is configured to support the plurality of wafers 200 on multiple stages, for example, 25 to 200 wafers, that are vertically arranged in a horizontal posture while centers thereof are aligned, that is, to support the wafers arranged at intervals. The boat 217 is made of a heat-resistant material such as quartz or SiC. Below the boat 217, an insulation plate 218 made of a heat-resistant material such as quartz or SiC is supported in a horizontal posture on multiple stages. According to such a configuration, heat from the heater 207 is not easily transferred to the seal cap 219 side. However, this embodiment is not limited thereto. For example, the insulation plate 218 may not be provided below the boat 217, but an insulation tube configured as a tubular member made of a heat-resistant material such as quartz or SiC may be provided.

A temperature sensor 263 serving as a temperature detector is provided in the reaction tube 203. By regulating power supply to the heater 207 based on information on the temperature detected by the temperature sensor 263, the temperature in the process chamber 201 is set to have a desired temperature distribution. Similar to the nozzles 249a to 249d, the temperature sensor 263 is configured in an L shape, and is provided along the inner wall of the reaction tube 203.

Figure 3:
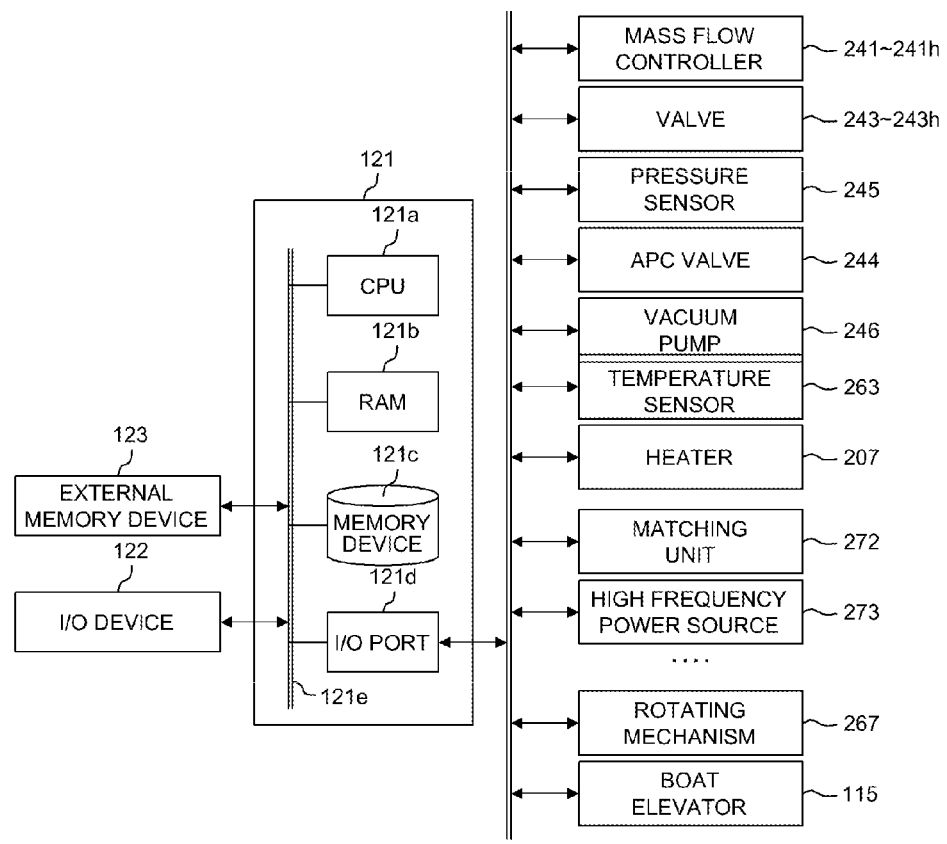
FIG. 3 is a diagram schematically illustrating a configuration of a controller of a substrate processing apparatus preferably used in embodiments of the present invention and is a block diagram illustrating a control system of the controller.

As illustrated in FIG. 3, a controller 121 serving as a control unit (control device) is configured as a computer that includes a central processing unit (CPU) 121a, a random access memory (RAM) 121b, a memory device 121c, and an input/output (I/O) port 121d. The RAM 121b, the memory device 121c, and the I/O port 121d are configured to exchange data with the CPU 121a through an internal bus 121e. An I/O device 122 configured as, for example, a touch panel, is connected to the controller 121.

The memory device 121c is configured as, for example, a flash memory, and a hard disk drive (HDD). A control program controlling operations of the substrate processing apparatus, a process recipe describing sequences or conditions of substrate processing (to be described below), and the like are readably stored in the memory device 121c. The process recipe, which is a combination of sequences, causes the controller 121 to execute each sequence in a substrate processing process to be described below in order to obtain a predetermined result, and functions as a program. Hereinafter, such a process recipe, a control program, and the like are collectively simply called a "program." When the term "program" is used in this specification, it may refer to either or both of the process recipe and the control program. The RAM 121b is configured as a memory area (work area) in which a program, data, and the like read by the CPU 121a are temporarily stored.

The I/O port 121d is connected to the MFCs 241a to 241h, the valves 243a to 243h, the pressure sensor 245, the APC valve 244, the vacuum pump 246, the heater 207, the temperature sensor 263, the high frequency power source 273, the matching unit 272, the rotating mechanism 267, the boat elevator 115 and the like.

The CPU 121a reads and executes the control program from the memory device 121c and reads the process recipe from the memory device 121c according to an input of a manipulating command from the I/O device 122. To comply with the content of the read process recipe, the CPU 121a is configured to control a flow rate regulating operation of various gases by the MFCs 241a to 241k, an on-off operation of the valves 243a to 243k, an on-off operation of the APC valve 244, a pressure regulating operation by the APC valve 244 based on the pressure sensor 245, starting and stopping of the vacuum pump 246, a temperature regulating operation by the heater 207 based on the temperature sensor 263, power supply of the high frequency power source 273, an impedance regulating operation by the matching unit 272, a rotation and rotational speed regulating operation of the boat 217 by the rotating mechanism 267, a lifting operation of the boat 217 by the boat elevator 115, and the like.

The controller 121 is not limited to being configured as a dedicated computer but may be configured as a general-purpose computer. For example, the controller 121 according to this embodiment may be configured by preparing an external memory device 123 [for example, a magnetic tape, a magnetic disk such as a flexible disk and a hard disk, an optical disc such as a compact disc (CD) and a digital video disc (DVD), a magneto-optical disc such as an MO, and a semiconductor memory such as a Universal Serial Bus (USB) memory and a memory card] recording the above program, and then installing the program in the general-purpose computer using the external memory device 123. However, a method of supplying the program to the computer is not limited to using the external memory device 123. For example, a communication line such as the Internet or an exclusive line may be used to supply the program without using the external memory device. The memory device 121c or the external memory device 123 is configured as a non-transitory computer-readable recording medium. Hereinafter, these are also collectively simply called a recording medium. When the term "recording medium" is used in this specification, it refers to either or both of the memory device 121c and the external memory device 123.

(2) Substrate Processing Process

Next, as a process among manufacturing processes of a semiconductor apparatus (semiconductor device) using the processing furnace of the above-described substrate processing apparatus, an exemplary sequence of forming a thin film on a substrate will be described. In the following description, operations of respective units constituting the substrate processing apparatus are controlled by the controller 121.

In a film formation sequence of the present embodiment, a laminate film in which a first film and a second film are laminated on a substrate is formed by performing a cycle a predetermined number of times under a condition in which a borazine ring structure in a fourth process gas is maintained. The cycle includes a process of forming a film free of the borazine ring structure and including boron and nitrogen (hereinafter also referred to as a non-borazine-based BN film) or a film free of the borazine ring structure and including boron, carbon and nitrogen (hereinafter also referred to as a non-borazine-based BCN film) as the first film by performing a first set a predetermined number of times wherein the first set includes a process of supplying a first process gas free of the borazine ring structure and including boron to the substrate and a process of supplying a second process gas including nitrogen or nitrogen and C; and a process of forming a film having the borazine ring structure and including boron and nitrogen (hereinafter also referred to as a borazine-based BN film) or a film having the borazine ring structure and including boron, carbon and nitrogen (hereinafter also referred to as a borazine-based BCN film) as the second film by performing a second set a predetermined number of times wherein the second set includes a process of supplying a third process gas to the substrate and a process of supplying a fourth process gas having the borazine ring structure and an organic ligand to the substrate.

In the process of supplying the third process gas, a gas containing at least one of a gas free of the borazine ring structure and including boron, a gas containing nitrogen and a gas containing nitrogen and carbon is supplied to the substrate.

When it is described that "the first set including the process of supplying the first process gas and the process of supplying the second process gas is performed a predetermined number of times," it means that, when a set including alternately or simultaneously performing the process of supplying the first process gas and the process of supplying the second process gas is set as the first set, the first set is performed once or a plurality of times. That is, it means that the first set is performed once or more. However, the first set is preferably performed a plurality of times.

When it is described that "the second set including the process of supplying the third process gas and the process of supplying the fourth process gas is performed a predetermined number of times," it means that, when a set including alternately or simultaneously performing the process of supplying the third process gas and the process of supplying the fourth process gas is set as the second set, the second set is performed once or a plurality of times. That is, it means that the second set is performed once or more. However, the second set is preferably performed a plurality of times.

When it is described that "the cycle including the process of forming the first film and the process of forming the second film is performed a predetermined number of times," it means that, when a cycle including alternately performing the process of forming the first film and the process of forming the second film is set as a cycle, this cycle is performed once or a plurality of times. That is, it means that the cycle is performed once or more. However, the cycle is preferably performed a plurality of times.

Hereinafter, the film formation sequence of the present embodiment will be described with reference to FIG. 4.

Figure 4:
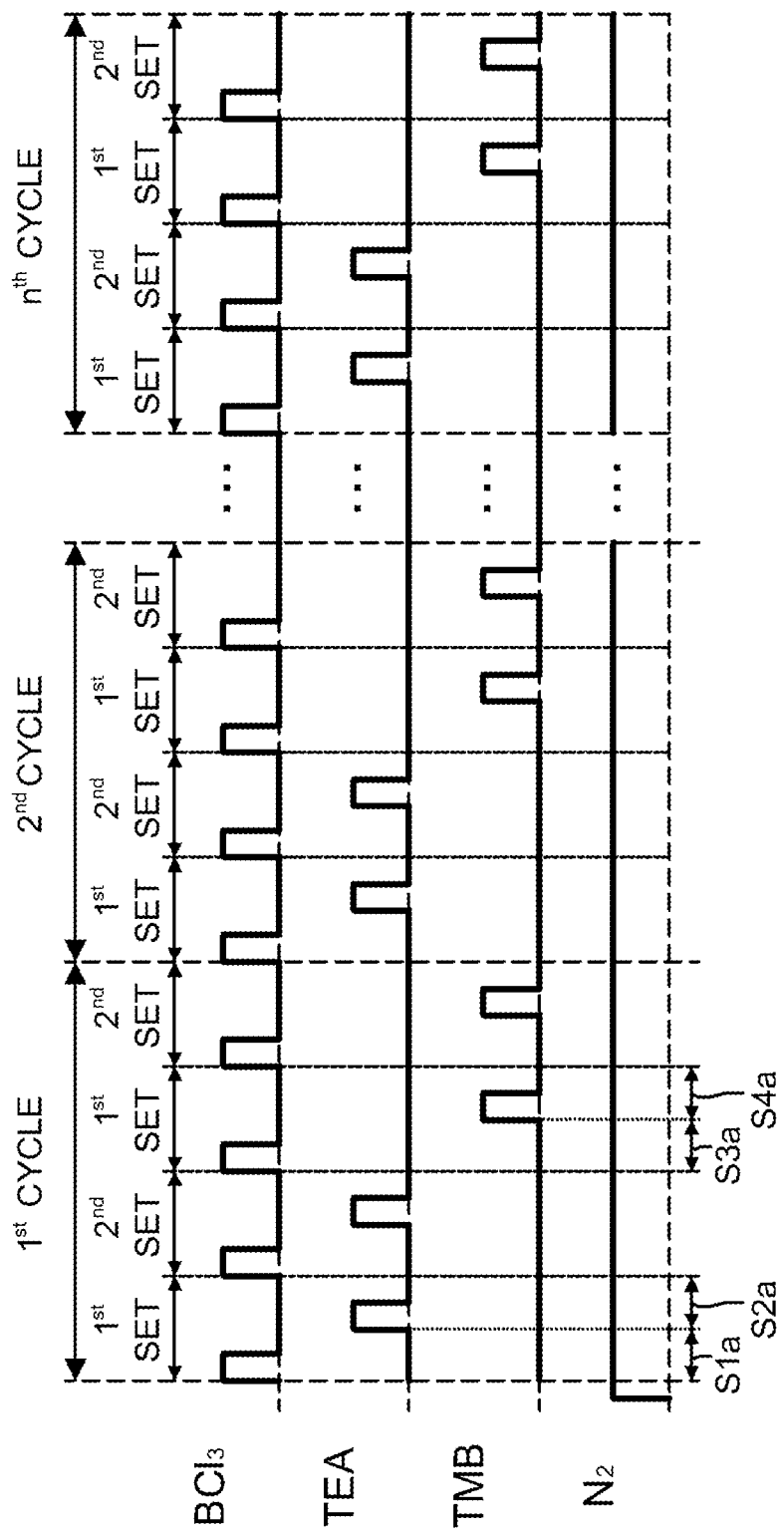
FIG. 4 is a diagram illustrating a gas supply timing in a film formation sequence of a first embodiment.

In a film formation sequence illustrated in FIG. 4, a laminate film in which a non-borazine-based BCN film and a borazine-based BCN film are laminated is formed on the wafer 200 by performing a cycle a predetermined number of times under a condition where a borazine ring structure in the organic borazine-based gas (TMB gas) serving as the fourth process gas is maintained. The cycle includes a process of forming the non-borazine-based BCN film as a first film by performing a first set a predetermined number of times, wherein the first set includes a process of supplying the chloroborane-based source gas ($BCl_3$ gas) as the first process gas free of the borazine ring structure and including boron to the wafer 200 and a process of supplying the amine-based gas (TEA gas) as the second process gas including nitrogen or nitrogen and carbon to the wafer 200; and a process of forming the borazine-based BCN film as a second film by performing a second set a predetermined number of times, wherein the second set includes a process of supplying the chloroborane-based source gas ($BCl_3$ gas) as the third process gas to the wafer 200 and a process of supplying the organic borazine-based gas (TMB gas) as the fourth process gas having the borazine ring structure and an organic ligand to the wafer 200.

FIG. 4 exemplifies a case in which a cycle is performed a predetermined number of times (n times), a plurality of times here. The cycle includes alternately performing a first set a predetermined number of times ($m_1$ times), a plurality of times here, and specifically, twice, and performing a second set a predetermined number of times ($m_2$ times), a plurality of times here, and specifically, twice. The first set includes a process of supplying the chloroborane-based source gas ($BCl_3$ gas) and a process of supplying the amine-based gas (TEA gas). The second set includes a process of supplying the chloroborane-based source gas ($BCl_3$ gas) and a process of supplying the organic borazine-based gas (TMB gas). That is, a case in which $m_1=2$ and $m_2=2$ is exemplified. Also, $m_1$ and $m_2$ may each be set to be equal to 1, and preferably, $m_1=1$ to 10, and $m_2=1$ to 10.

A laminate film (nanolaminate film) in which the non-borazine-based BCN film and the borazine-based BCN film are alternately laminated at a nano level is formed by performing a cycle a predetermined number of times. The cycle includes a process of forming the non-borazine-based BCN film as the first film by performing the first set a predetermined number of times and a process of forming the borazine-based BCN film as the second film by performing the second set a predetermined number of times.

When the term "wafer" is used in this specification, it refers to "the wafer itself," or a "laminate (aggregate) of a wafer, a predetermined layer, film, and the like formed on a surface thereof," that is, the wafer refers to a wafer including a predetermined layer, film, and the like formed on a surface thereof. In addition, when the term "surface of the wafer" is used in this specification, it refers to "a surface (exposed surface) of the wafer itself" or "a surface of a predetermined layer, film, and the like formed on the wafer, that is, the outermost surface of the wafer as the laminate."

Therefore, when it is described in this specification that "a predetermined gas is supplied to the wafer," it means that "a predetermined gas is directly supplied to a surface (exposed surface) of the wafer itself" or "a predetermined gas is supplied to a layer, film, and the like formed on the wafer, that is, to the outermost surface of the wafer as the laminate." In addition, when it is described in this specification that "a predetermined layer (or film) is formed on the wafer," it means that "a predetermined layer (or film) is directly formed on a surface (exposed surface) of the wafer itself" or "a predetermined layer (or film) is formed on a layer, film, and the like formed on the wafer, that is, a predetermined layer (or film) is formed on the outermost surface of the wafer as the laminate."

The terms "substrate" and "wafer" as used in this specification have the same meanings. Thus, the term "wafer" in the above description may be replaced with the term "substrate."

[Wafer Charging and Boat Loading]

When the plurality of wafers 200 are loaded (wafer charging) on the boat 217, the boat 217 supporting the plurality of wafers 200 is lifted by the boat elevator 115 and is loaded (boat loading) into the process chamber 201, as illustrated in FIG. 1. In this state, the lower end of the reaction tube 203 is sealed by the seal cap 219 through the O ring 220.

[Pressure Regulation and Temperature Regulation]

Vacuum exhaust is performed by the vacuum pump 246 such that a pressure in the process chamber 201, that is, a pressure in a space in which the wafer 200 is present, is a desired pressure (degree of vacuum). In this case, the pressure in the process chamber 201 is measured by the pressure sensor 245, and the APC valve 244 is feedback-controlled based on information on the measured pressure. The vacuum pump 246 is continuously operated at least until processing on the wafer 200 is completed. In addition, the wafer 200 in the process chamber 201 is heated to a desired temperature by the heater 207. In this case, based on information on the temperature detected by the temperature sensor 263, power supply to the heater 207 is feedback-controlled such that an inside of the process chamber 201 has a desired temperature distribution. The heating of the inside of the process chamber 201 by the heater 207 is continuously performed at least until processing on the wafer 200 is completed. Subsequently, the rotating mechanism 267 begins to rotate the boat 217 and the wafer 200. The rotation of the boat 217 and the wafer 200 by the rotating mechanism 267 is continuously performed at least until processing on the wafer 200 is completed.

[Non-Borazine-Based BCN Film (First Film) Formation Process]

Then, the following two steps, steps S1a and S2a, are sequentially performed.

[Step S1a] (BCl$_3$ Gas Supply)

The valve 243a is opened to flow BCl$_3$ gas into the gas supply pipe 232a. BCl$_3$ gas has a flow rate that is regulated by the MFC 241a, is supplied into the process chamber 201 through the gas supply hole 250a and exhausted through the exhaust pipe 231. In this case, BCl$_3$ gas is supplied to the wafer 200. In this case, at the same time, the valve 243e is opened to flow the inert gas such as N$_2$ gas into the gas supply pipe 232e. N$_2$ gas has a flow rate that is regulated by the MFC 241e, and is supplied into the process chamber 201 along with BCl$_3$ gas and exhausted through the exhaust pipe 231.

In this case, in order to prevent BCl$_3$ gas from being introduced into the nozzles 249b to 249d and the buffer chamber 237, the valves 243f to 243h are opened to flow N$_2$ gas into the gas supply pipes 232f to 232h. N$_2$ gas is supplied into the process chamber 201 through the gas supply pipes 232b to 232d, the nozzles 249b to 249d and the buffer chamber 237 and is exhausted through the exhaust pipe 231.

In this case, by appropriately adjusting the APC valve 244, a pressure in the process chamber 201 is set to, for example, a pressure in a range of 1 Pa to 13,300 Pa, and preferably 20 Pa to 1,330 Pa. A supply flow rate of BCl$_3$ gas controlled by the MFC 241a is set to, for example, a flow rate in a range of 1 sccm to 2,000 sccm, and preferably 1 sccm to 1,000 sccm. A supply flow rate of N$_2$ gas controlled by each of the MFCs 241e to 241h is set to, for example, a flow rate in a range of 100 sccm to 10,000 sccm. A time for which BCl$_3$ gas is supplied to the wafer 200, that is, a gas supply time [radiation time], is set to, for example, a time in a range of 1 to 120 seconds, and preferably 1 to 60 seconds. In this case, a temperature of the heater 207 is set such that a temperature of the wafer 200 is set to, for example, a temperature in a range of 250° C. to 700° C., preferably 300° C. to 650° C., and more preferably 350° C. to 600° C.

When the temperature of the wafer 200 is less than 250° C., it is difficult for BCl$_3$ to be chemically adsorbed onto the wafer 200, and a practical film formation rate may not be obtained. When the temperature of the wafer 200 is set to 250° C. or more, it is possible to address this problem. When the temperature of the wafer 200 is set to 300° C. or more and set to 350° C. or more, it is possible for BCl$_3$ to be more sufficiently adsorbed onto the wafer 200, thereby obtaining a more sufficient film formation rate.

When the temperature of the wafer 200 is greater than 700° C., a CVD reaction becomes strong [a gas-phase reaction is dominant], film thickness uniformity is likely to be degraded and control thereof becomes difficult. When the temperature of the wafer 200 is set to 700° C. or less, it is possible to suppress degradation of film thickness uniformity and thus control thereof is possible. In particular, when the temperature of the wafer 200 is set to 650° C. or less and 600° C. or less, a surface reaction becomes dominant, film thickness uniformity is easily ensured, and control thereof becomes easy.

Therefore, the temperature of the wafer 200 may be set to a temperature in a range of 250° C. to 700° C., preferably 300° C. to 650° C., and more preferably 350° C. to 600° C.

When BCl$_3$ gas is supplied to the wafer 200 under the above-described conditions, a boron-containing layer that contains chlorine and has a thickness of, for example, about less than one atomic layer to several atomic layers, is formed on the wafer 200 [a base film of the surface] as a first layer. The first layer may include either or both of an adsorption layer of BCl$_3$ gas or a boron layer containing chlorine.

The boron layer containing chlorine generally refers to a continuous layer that is formed of boron and contains chlorine, a discontinuous layer, or a boron thin film that is formed by these layers overlapping and contains chlorine. The continuous layer that is formed of boron and contains chlorine may also be called a boron thin film containing chlorine. Boron that constitutes the boron layer containing chlorine has a bond with chlorine which is not completely broken and a bond with chlorine which is completely broken.

The adsorption layer of BCl$_3$ gas includes a chemical adsorption layer in which gas molecules of BCl$_3$ gas are continuous and a chemical adsorption layer in which gas molecules of BCl$_3$ gas are discontinuous. That is, the adsorption layer of BCl$_3$ gas includes a chemical adsorption layer that is formed of BCl$_3$ molecules and has a thickness of one molecular layer or less than one molecular layer. BCl$_3$ molecules forming the adsorption layer of BCl$_3$ gas include molecules in which a bond between boron and chlorine is partially broken.

Here, "layer having a thickness of less than one atomic layer" refers to a discontinuously formed atomic layer. "Layer having a thickness of one atomic layer" refers to a continuously formed atomic layer. "Layer having a thickness of less than one molecular layer" refers to a discontinuously formed molecular layer. "Layer having a thickness of one molecular layer" refers to a continuously formed molecular layer.

Under conditions in which BCl$_3$ gas is self-decomposed (pyrolyzed), that is, conditions causing a pyrolysis reaction of BCl$_3$, when boron is deposited on the wafer 200, the boron layer containing chlorine is formed. Under conditions in which BCl$_3$ gas is not self-decomposed (pyrolyzed), that is, conditions that do not cause a pyrolysis reaction of BCl$_3$, when BCl$_3$ gas is adsorbed onto the wafer 200, the adsorption layer of BCl$_3$ gas is formed. Forming the boron layer containing chlorine on the wafer 200 is preferable since a film formation rate is higher when the boron layer containing chlorine is formed on the wafer 200 than when the adsorption layer of BCl$_3$ gas is formed on the wafer 200.

When a thickness of the first layer formed on the wafer 200 is greater than several atomic layers, a modification action in step S2a to be described below does not influence the entire first layer. Also, a minimum thickness of the first layer that may be formed on the wafer 200 is less than one atomic layer. Therefore, the thickness of the first layer is preferably set to about less than one atomic layer to several atomic layers. Also, when the thickness of the first layer is set to one atomic layer or less, that is, one atomic layer or less than one atomic layer, an effect of a modification reaction in step S2a to be described below may relatively increase and a time required for the modification reaction in step S2a may be reduced. A time required for forming the first layer in Step S1a may also be reduced. As a result, it is possible to reduce a processing time for one cycle and a total processing time may thus be reduced. That is, it is possible to increase the film formation rate. Also, when the thickness of the first layer is set to one atomic layer or less, it is possible to increase controllability of film thickness uniformity.

[Residual Gas Removal]

After the first layer is formed, the valve 243a is closed to stop supply of BCl$_3$ gas. In this case, while the APC valve 244 is opened, the inside of the process chamber 201 is vacuum-exhausted by the vacuum pump 246 and an unreacted gas remaining in the process chamber 201 or BCl$_3$ gas that has contributed to formation of the first layer is removed from the inside of the process chamber 201. In this case, while the valves 243e to 243h are opened, supply of N$_2$ gas serving as the inert gas into the process chamber 201 continues. N$_2$ gas serves as a purge gas. Therefore, it is possible to increase an effect of removing an unreacted gas remaining in the process chamber 201 or BCl$_3$ gas that has contributed to formation of the first layer from the inside of the process chamber 201.

In this case, a gas remaining in the process chamber 201 may not be completely removed and the inside of the process chamber 201 may not be completely purged. When an amount of a gas remaining in the process chamber 201 is small, there is no negative influence on step S2a performed thereafter. In this case, there is no need to set a flow rate of N$_2$ gas supplied into the process chamber 201 to be high. For example, when the same amount of N$_2$ gas as a volume of the reaction tube 203 (the process chamber 201) is supplied, it is possible to purge to the extent that there is no negative influence on step S2a. When the inside of the process chamber 201 is not completely purged, a purge time decreases, thereby improving throughput. Also, it is possible to suppress unnecessary consumption of N$_2$ gas to a minimum.

As the chloroborane-based source gas, in addition to BCl$_3$ gas, an inorganic source gas such as monochloroborane (BClH$_2$) gas and dichloroborane (BCl$_2$H) gas, and an organic source gas such as chlorodimethylborane (C$_2$H$_6$BCl) gas, methylethylchloroborane (CH$_3$C$_2$H$_5$BCl) gas, methyldichloroborane (CH$_3$BCl$_2$) gas, ethyldichloroborane (C$_2$H$_5$BCl$_2$) gas, dichlorophenylborane (C$_6$H$_5$BCl$_2$) gas and dichloro(cyclohexyl)borane (C$_6$H$_{11}$BCl$_2$) gas may be used. As the inert gas, in addition to N$_2$ gas, rare gases such as Ar gas, He gas, Ne gas and Xe gas may be used.

[Step S2a]

(TEA Gas Supply)

Step S1a ends, the residual gas in the process chamber 201 is removed and then the valve 243b is opened to flow TEA gas into the gas supply pipe 232b. TEA gas has a flow rate that is regulated by the MFC 241b, and is supplied into the process chamber 201 through the gas supply hole 250b and exhausted through the exhaust pipe 231. In this case, thermally activated TEA gas is supplied to the wafer 200. In this case, at the same time, the valve 243f is opened to flow N$_2$ gas serving as the inert gas into the gas supply pipe 232f. N$_2$ gas has a flow rate that is regulated by the MFC 241f, and is supplied into the process chamber 201 along with TEA gas and exhausted through the exhaust pipe 231.

In this case, in order to prevent TEA gas from being introduced into the nozzles 249a, 249c and 249d and the buffer chamber 237, the valves 243e, 243g and 243h are opened to flow N$_2$ gas into the gas supply pipes 232e, 232g and 232h. N$_2$ gas is supplied into the process chamber 201 through the gas supply pipes 232a, 232c and 232d, the nozzles 249a, 249c and 249d and the buffer chamber 237 and is exhausted through the exhaust pipe 231.

In this case, by appropriately adjusting the APC valve 244, the pressure in the process chamber 201 is set to, for example, a pressure in a range of 1 Pa to 13,300 Pa, and preferably 399 Pa to 3,990 Pa. When the pressure in the process chamber 201 is set to a relatively high pressure range in this manner, TEA gas may be thermally activated to non plasma. When TEA gas is thermally activated and then supplied, since a soft reaction may be caused, a modification to be described below may be softly performed. A supply flow rate of TEA gas controlled by the MFC 241b is set to, for example, a flow rate in a range of 100 sccm to 2,000 sccm. A supply flow rate of N$_2$ gas controlled by each of the MFCs 241e to 241h is set to, for example, a flow rate in a range of 100 sccm to 10,000 sccm. In this case, a partial pressure of TEA gas in the process chamber 201 is set to a pressure in a range of 0.01 Pa to 12,667 Pa. A time for which thermally activated TEA gas is supplied to the wafer 200, that is, a gas supply time (radiation time) is set to, for example, a time in a range of 1 to 120 seconds, and preferably 1 to 60 seconds. In this case, similar to step S1a, the temperature of the heater 207 is set such that the temperature of the wafer 200 is set to, for example, a temperature in a range of 250° C. to 700° C., preferably 300° C. to 650° C., and more preferably 350° C. to 600° C.

When TEA gas is supplied to the wafer 200 under the above-described conditions, the first layer formed on the wafer 200 in step S1a may react with TEA gas. That is, chlorine atoms (chloro group), which are a halogen element included in the first layer, and a ligand (ethyl group) included in TEA gas may react. Therefore, at least some chlorine of chlorine included in the first layer may be extracted (separated) from the first layer and at least some ethyl groups among a plurality of ethyl groups included in TEA gas may be separated from TEA gas. Also, nitrogen of TEA gas from which at least some ethyl groups are separated and boron included in the first layer may be combined. That is, it is possible to form a B—N bond by combining nitrogen that forms TEA gas and has a dangling bond due to a disconnection of at least some ethyl groups with boron that has a dangling bond due to inclusion in the first layer or boron having a dangling bond. Also, in this case, it is possible to form a B—C bond by combining carbon included in an ethyl group (—CH$_2$CH$_3$) separated from TEA gas with boron included in the first layer. As a result, chlorine is desorbed from the first layer and a nitrogen component is newly added into the first layer. Also, in this case, a carbon component is newly added into the first layer.

According to the reactions in series, chlorine is desorbed from the first layer and the nitrogen component and the carbon component are newly added into the first layer. The first layer is changed (modified) to a second layer containing boron, nitrogen and carbon, that is, a boron carbonitride layer (BCN layer). The second layer becomes a layer having a thickness of less than one atomic layer to several atomic layers. The second layer becomes, for example, a layer having a relatively high boron component ratio and carbon component ratio, that is, a boron-rich and carbon-rich layer.

When a layer containing boron, nitrogen and carbon is formed as the second layer, chlorine included in the first layer or hydrogen included in TEA gas forms a gaseous material, for example, chlorine (Cl$_2$) gas, hydrogen (H$_2$) gas or hydrogen chloride (HCl) gas, during the modification reaction of the first layer due to TEA gas and is discharged from the inside of the process chamber 201 through the exhaust pipe 231. That is, impurities such as chlorine in the first layer are extracted or desorbed from the first layer and thus separated from the first layer. Therefore, the second layer becomes a layer having fewer impurities such as chlorine than the first layer.

[Residual Gas Removal]

After the second layer is formed, the valve 243b is closed to stop supply of TEA gas. In this case, while the APC valve 244 is opened, the inside of the process chamber 201 is vacuum-exhausted by the vacuum pump 246, and an unreacted gas remaining in the process chamber 201, TEA gas that has contributed to formation of the second layer or reaction by-products are removed from the inside of the process chamber 201. In this case, while the valves 243e to 243h are opened, supply of $N_2$ gas serving as the inert gas into the process chamber 201 continues. $N_2$ gas serves as the purge gas. Therefore, it is possible to increase an effect of removing an unreacted gas remaining in the process chamber 201, TEA gas that has contributed to formation of the second layer or reaction by-products from the inside of the process chamber 201. In this case, a gas remaining in the process chamber 201 may not be completely removed and the inside of the process chamber 201 may not be completely purged, similar to step S1a.

As the amine-based gas, in addition to TEA gas, an ethylamine-based gas such as diethylamine [$(C_2H_5)_2NH$, abbreviation: DEA] gas and monoethylamine ($C_2H_5NH_2$, abbreviation: MEA) gas, a methylamine-based gas such as trimethylamine [$(CH_3)_3N$, abbreviation: TMA] gas, dimethylamine [$(CH_3)_2NH$, abbreviation: DMA] gas and monomethylamine ($CH_3NH_2$, abbreviation: MMA) gas, a propylamine-based gas such as tripropylamine [$(C_3H_7)_3N$, abbreviation: TPA] gas, dipropylamine [$(C_3H_7)_2NH$, abbreviation: DPA] gas and monopropylamine ($C_3H_7NH_2$, abbreviation: MPA) gas, an isopropylamine-based gas such as triisopropylamine ([$(CH_3)_2CH]_3N$, abbreviation: TIPA) gas, diisopropylamine ([$(CH_3)_2CH]_2NH$, abbreviation: DIPA) gas and monoisopropylamine [$(CH_3)_2CHNH_2$, abbreviation: MIPA] gas, a butylamine-based gas such as tributylamine [$(C_4H_9)_3N$, abbreviation: TBA] gas, dibutylamine [$(C_4H_9)_2NH$, abbreviation: DBA] gas and monobutylamine ($C_4H_9NH_2$, abbreviation: MBA) gas, or an isobutylamine-based gas such as triisobutylamine ([$(CH_3)_2CHCH_2]_3N$, abbreviation: TIBA) gas, diisobutylamine ([$(CH_3)_2CHCH_2]_2NH$, abbreviation: DIBA) gas and monoisobutylamine [$(CH_3)_2CHCH_2NH_2$, abbreviation: MIBA] gas may be preferably used. That is, as the amine-based gas, for example, at least one type of gas among $(C_2H_5)_xNH_{3-x}$, $(CH_3)_xNH_{3-x}$, $(C_3H_7)_xNH_{3-x}$, $[(CH_3)_2CH]_xNH_{3-x}$, $(C_4H_9)_xNH_{3-x}$ and $[(CH_3)_2CHCH_2]_xNH_{3-x}$ (in the expressions, x denotes an integer of 1 to 3) may be preferably used.

As the amine-based gas, a gas that is formed of the three elements carbon, nitrogen and hydrogen and includes a greater number of carbon atoms than nitrogen atoms in its composition formula (in a molecule) may be used. That is, as the amine-based gas, a gas containing at least one amine selected from the group consisting of TEA, DEA, MEA, TMA, DMA, TPA, DPA, MPA, TIPA, DIPA, MIPA, TBA, DBA, MBA, TIBA, DIBA and MIBA may be used.

When the chloroborane-based source gas including boron and a halogen element (Cl) such as $BCl_3$ gas is used as the source gas, if the amine-based gas that is formed of the three elements carbon, nitrogen and hydrogen and includes a greater number of carbon atoms than nitrogen atoms in its composition formula (in a molecule) such as TEA gas or DEA gas is used as the reactive gas, it is possible to increase a carbon concentration in the second layer formed in step S2a, that is, it is possible to increase a carbon concentration in a BCN film formed during performing a process a predetermined number of times to be described below. For example, according to the film formation sequence of the present embodiment, it is possible to set the carbon concentration in the BCN film to be formed to 25 at % or more, for example, to a high concentration of 40 at % or more.

On the other hand, when the chloroborane-based source gas including boron and a halogen element (Cl) such as $BCl_3$ gas is used as the source gas, if the amine-based gas such as MMA gas or a gas that is formed of the three elements carbon, nitrogen and hydrogen and has the number of carbon atoms included therein that is equal to or less than the number of nitrogen atoms in its composition formula (in a molecule) such as an organic hydrazine-based gas, for example, MMH gas or DMH gas to be described below is used as the reactive gas, it is possible to set the carbon concentration in the second layer, that is, the carbon concentration in the BCN film to be smaller compared to when the amine-based gas that is formed of the three elements carbon, nitrogen and hydrogen and includes a greater number of carbon atoms than nitrogen atoms in its composition formula (in a molecule) is used as the reactive gas.

Also, as the amine-based gas, a gas including a plurality of ligands that contain carbon atoms in its composition formula (in a molecule), that is, a gas containing a plurality of hydrocarbon groups such as an alkyl group in its composition formula (in a molecule) may be used. Specifically, as the amine-based gas, a gas containing three or two ligands (hydrocarbon groups such as an alkyl group) that include carbon atoms in its composition formula (in a molecule) may be used. For example, a gas containing at least one amine selected from the group consisting of TEA, DEA, TMA, DMA, TPA, DPA, TIPA, DIPA, TBA, DBA, TIBA and DIBA may be used.

When the chloroborane-based source gas including boron and a halogen element (Cl) such as $BCl_3$ gas is used as the source gas, if the amine-based gas that is formed of the three elements carbon, nitrogen and hydrogen and includes a plurality of ligands containing carbon atoms in its composition formula (in a molecule) such as TEA gas or DEA gas is used as the reactive gas, that is, if the amine-based gas including a plurality of hydrocarbon groups such as an alkyl group in its composition formula (in a molecule) is used, it is possible to further increase the carbon concentration in the second layer, that is, the carbon concentration in the BCN film.

On the other hand, when the chloroborane-based source gas including boron and a halogen element (Cl) such as $BCl_3$ gas is used as the source gas, if the amine-based gas such as MMA gas or a gas that does not include a plurality of ligands that contain carbon atoms in its composition formula (in a molecule) such as an organic hydrazine-based gas, for example, MMH gas to be described below, is used as the reactive gas, it is possible to set the carbon concentration in the second layer, that is, the carbon concentration in the BCN film, to be lower than when the amine-based gas including a plurality of ligands that contain carbon atoms in its composition formula (in a molecule) is used as the reactive gas.

Also, when the amine-based gas that includes two ligands containing carbon atoms in its composition formula (in a molecule) such as DEA gas is used as the reactive gas, it is possible to further increase a cycle rate (a thickness of the BCN layer to be formed per unit cycle) and it is possible to further increase a ratio (a ratio of nitrogen concentration to carbon concentration) of the nitrogen concentration with respect to the carbon concentration in the second layer, that is, a ratio (a ratio of nitrogen concentration to carbon concentration) of the nitrogen concentration with respect to the carbon concentration in the BCN film compared to when the amine-based gas that includes three ligands containing carbon atoms in its composition formula (in a molecule) such as TEA gas is used.

On the other hand, when the amine-based gas that includes three ligands containing carbon atoms in its composition formula (in a molecule) such as TEA gas is used as the reactive gas, it is possible to further increase a ratio (a ratio of carbon concentration to nitrogen concentration) of the carbon concentration with respect to the nitrogen concentration in the second layer, that is, a ratio (a ratio of carbon concentration to nitrogen concentration) of the carbon concentration with respect to the nitrogen concentration in the BCN film, compared to when the amine-based gas that includes two ligands containing carbon atoms in its composition formula (in a molecule) such as DEA gas is used.

That is, according to the number (the number of hydrocarbon groups such as an alkyl group) of ligands that contain carbon atoms included in the reactive gas, in other words, by appropriately changing a gas type of the reactive gas, it is possible to finely regulate the cycle rate or the nitrogen concentration or the carbon concentration in the BCN film to be formed.

As described above, when a gas type (composition) of the amine-based gas used as the reactive gas is appropriately selected, it is possible to increase the carbon concentration in the BCN film. Also, in order to further increase the carbon concentration, for example, the pressure in the process chamber 201 when the amine-based gas (TEA gas) is supplied to the wafer 200 is preferably set to be higher than the pressure in the process chamber 201 when the chloroborane-based source gas ($BCl_3$ gas) is supplied to the wafer 200 in step S1a. That is, if the pressure in the process chamber 201 when $BCl_3$ gas is supplied to the wafer 200 is set to $P_1$ [Pa], and the pressure in the process chamber 201 when TEA gas is supplied to the wafer 200 is set to $P_2$ [Pa], pressures $P_1$ and $P_2$ are preferably set to satisfy a relation of $P_2 > P_1$.

On the other hand, in order to appropriately suppress an increment of the carbon concentration in the BCN film, the pressure in the process chamber 201 when the amine-based gas (TEA gas) is supplied to the wafer 200 is preferably set to be equal to or lower than the pressure in the process chamber 201 when the chloroborane-based source gas ($BCl_3$ gas) is supplied to the wafer 200 in step S1a. That is, the pressures $P_1$ and $P_2$ are preferably set to satisfy a relation of $P_1 \geq P_2$.

That is, by appropriately controlling the pressure in the process chamber 201 when the amine-based gas is supplied, it is possible to finely regulate the carbon concentration in the BCN film to be formed.

As the inert gas, in addition to $N_2$ gas, rare gases such as Ar gas, He gas, Ne gas and Xe gas may also be used.

[Performing a Predetermined Number of Times]

When the first set including steps S1a and S2a is performed once or more (a predetermined number of times), that is, when steps S1a and S2a are alternately performed once or more (a predetermined number of times), it is possible to form the non-borazine-based BCN film having a predetermined composition and a predetermined film thickness on the wafer 200 as the first film. The first set is preferably repeated a plurality of times. That is, a thickness of the BCN layer to be formed for one set is set to be smaller than a desired film thickness and the first set is preferably repeated a plurality of times to obtain the desired film thickness.

When the first set is performed a plurality of times, if it is described that "a predetermined gas is supplied to the wafer 200" in each step after at least a second time, it means that "a predetermined gas is supplied to a layer formed on the wafer 200, that is, to the outermost surface of the wafer 200, which is a laminate" and if it is described that "a predetermined layer is formed on the wafer 200," it means that "a predetermined layer is formed on a layer formed on the wafer 200, that is, on the outermost surface of the wafer 200, which is a laminate." This is the same as described above and will be the same in other embodiments to be described below.

[Borazine-Based BCN Film (Second Film) Formation Process]

Next, the following two steps, steps S3a and S4a, are sequentially performed.

[Step S3a]
($BCl_3$ Gas Supply)

According to the same process sequence and process conditions as in Step S1a, $BCl_3$ gas is supplied to the wafer 200. Therefore, on the non-borazine-based BCN film formed on the wafer 200, for example, a boron-containing layer that includes chlorine and has a thickness of less than one atomic layer to several atomic layers is formed as a third layer.

[Residual Gas Removal]

After the third layer is formed, according to the same process sequence as in step S1a, supply of $BCl_3$ gas is stopped and an unreacted gas remaining in the process chamber 201 or $BCl_3$ gas that has contributed to formation of the third layer is removed from the inside of the process chamber 201. In this case, a gas remaining in the process chamber 201 may not be completely removed and the inside of the process chamber 201 may not be completely purged, similar to step S1a.

[Step S4a]
(TMB Gas Supply)

Step S3a ends, the residual gas in the process chamber 201 is removed and then the valve 243d is opened to flow TMB gas into the gas supply pipe 232d. TMB gas has a flow rate that is regulated by the MFC 241d, and is supplied into the process chamber 201 through the gas supply hole 250d and exhausted through the exhaust pipe 231. In this case, TMB gas is supplied to the wafer 200. In this case, at the same time, the valve 243h is opened to flow $N_2$ gas serving the inert gas into the gas supply pipe 232h. $N_2$ gas has a flow rate that is regulated by the MFC 241h, and is supplied into the process chamber 201 along with TMB gas and exhausted through the exhaust pipe 231.

Also, in this case, in order to prevent TMB gas from being introduced into the nozzles 249a, 249b and 249c and the buffer chamber 237, the valves 243e, 243f and 243g are opened to flow $N_2$ gas into the gas supply pipes 232e, 232f and 232g. $N_2$ gas is supplied into the process chamber 201 through the gas supply pipes 232a, 232b and 232c, the nozzles 249a, 249b and 249c and the buffer chamber 237 and is exhausted through the exhaust pipe 231.

In this case, by appropriately adjusting the APC valve 244, the pressure in the process chamber 201 is set to, for example, a pressure in a range of 1 Pa to 13,300 Pa, and preferably 500 Pa to 5,000 Pa. A supply flow rate of TMB gas controlled by the MFC 241d is set to, for example, a flow rate in a range of 1 sccm to 1,000 sccm. A supply flow rate of $N_2$ gas controlled by each of the MFCs 241e to 241h is set to, for example, a flow rate in a range of 100 sccm to 10,000 sccm. A time for which TMB gas is supplied to the wafer 200, that is, a gas supply time (radiation time), is set to, for example, a time in a range of 1 to 120 seconds, and preferably 1 to 60 seconds. In this case, similar to step S1a, the temperature of the heater 207 is set such that the temperature of the wafer 200 is set to, for example, a temperature in a range of 250° C. to 700° C., preferably 300° C. to 650° C., and more preferably 350° C. to 600° C.

When TMB gas is supplied to the wafer 200 under the above-described conditions, the third layer reacts with TMB gas. That is, chlorine (chloro group) included in the third layer and a ligand (methyl group) included in TMB may react. Therefore, chlorine of the third layer that has reacted with the ligand of TMB may be separated (extracted) from the third layer and the ligand of TMB that has reacted with chlorine of the third layer may be separated from TMB. Also, nitrogen forming the borazine ring of TMB from which the ligand is separated and boron of the third layer may be combined. That is, it is possible to form a B—N bond by combining nitrogen that has a dangling bond due to a disconnection of a methyl ligand of boron and nitrogen forming the borazine ring of TMB with boron that has a dangling bond due to inclusion in the third layer or boron having a dangling bond. In this case, the borazine ring structure forming the borazine ring of TMB is preserved without breaking.

When TMB gas is supplied under the above-described conditions, since the third layer and TMB may appropriately react while the borazine ring structure of TMB is preserved without breaking, it is possible to cause the above-described reactions in series. Also, while the borazine ring structure of TMB is preserved, the most important factors (conditions) for causing the reactions in series are considered to be the temperature of the wafer 200 and the pressure in the process chamber 201, and particularly, the temperature of the wafer 200. When these factors are appropriately controlled, it is possible to cause an appropriate reaction.

According to the reactions in series, the borazine ring is newly added into the third layer. The third layer is changed (modified) to a fourth layer that has the borazine ring structure and contains boron, carbon and nitrogen, that is, the BCN layer (also referred to as a borazine-based BCN layer) having the borazine ring structure. The fourth layer becomes, for example, a layer having a thickness of less than one atomic layer to several atomic layers.

When the borazine ring is newly added into the third layer, the nitrogen component of the borazine ring and the carbon component included in the ligand of TMB are newly added into the third layer. Also, in this case, the boron component of the borazine ring is newly added into the third layer. Accordingly, the fourth layer becomes a layer that includes a greater boron component in the layer than the third layer, that is, a boron-rich layer.

Also, when the fourth layer is formed, chlorine included in the third layer or hydrogen included in TMB gas forms a gaseous material, for example, chlorine ($Cl_2$) gas, hydrogen ($H_2$) gas or hydrogen chloride (HCl) gas, during the modification reaction of the first layer due to TMB gas and is discharged from the inside of the process chamber 201 through the exhaust pipe 231. That is, impurities such as chlorine in the third layer are extracted or desorbed from the third layer and thus separated from the third layer. Therefore, the fourth layer becomes a layer having fewer impurities such as chlorine than the third layer.

Also, when the fourth layer is formed, the borazine ring structure forming the borazine ring included in TMB is preserved without breaking. Accordingly, since a center space of the borazine ring may be preserved, it is possible to form a porous BCN layer.

[Residual Gas Removal]

After the fourth layer is formed, the valve 243d is closed to stop supply of TMB gas. In this case, while the APC valve 244 is opened, the inside of the process chamber 201 is vacuum-exhausted by the vacuum pump 246 and an unreacted gas remaining in the process chamber 201, TMB gas that has contributed to formation of the fourth layer or reaction by-products are removed from the inside of the process chamber 201. Also, in this case, while the valves 243e to 243h are opened, supply of $N_2$ gas serving as the inert gas into the process chamber 201 continues. $N_2$ gas serves as the purge gas. Therefore, it is possible to increase an effect of removing an unreacted gas remaining in the process chamber 201, TMB gas that has contributed to formation of the fourth layer or reaction by-products from the inside of the process chamber 201. In this case, a gas remaining in the process chamber 201 may not be completely removed and the inside of the process chamber 201 may not be completely purged, similar to step S1a.

As the organic borazine-based gas, in addition to TMB gas, for example, n,n',n''-triethylborazine (abbreviation: TEB) gas, n,n',n''-tri-n-propylborazine (abbreviation: TPB) gas, n,n',n''-triisopropylborazine (abbreviation: TIPB) gas, n,n', n''-tri-n-butylborazine (abbreviation: TBB) gas and n,n',n''-triisobutylborazine (abbreviation: TIBB) gas may be used. Also, TMB is a borazine compound that has the borazine ring structure and contains a methyl group as a ligand. TEB is a borazine compound that has the borazine ring structure and contains an ethyl group as a ligand. TPB is a borazine compound that has the borazine ring structure and contains a propyl group as a ligand. TIPB is a borazine compound that has the borazine ring structure and contains an isopropyl group as a ligand. TBB is a borazine compound that has the borazine ring structure and contains a butyl group as a ligand. TIBB is a borazine compound that has the borazine ring structure and contains an isobutyl group as a ligand.

[Performing a Predetermined Number of Times]

When the second set including steps S3a and S4a is performed once or more (a predetermined number of times), that is, when steps S3a and S4a are alternately performed once or more (a predetermined number of times), it is possible to form the borazine-based BCN film having a predetermined composition and a predetermined film thickness as the second film on the non-borazine-based BCN film serving as the first film. Also, the second set is preferably repeated a plurality of times. That is, a thickness of the BCN layer to be formed each time is set to be smaller than a desired film thickness and the second set is preferably repeated a plurality of times to obtain the desired film thickness.

In this case, when process conditions such as the pressure in the process chamber 201, the gas supply time and the like in each step are controlled, it is possible to finely regulate each element component in the BCN layer, that is, ratios of the boron component, the carbon component and the nitrogen component, that is, the boron concentration, the carbon concentration and the nitrogen concentration. Therefore, it is possible to control a composition ratio of the BCN film more precisely.

[Process of Performing a Predetermined Number of Times]

When a cycle including the process of forming the first film and the process of forming the second film is performed once or more (a predetermined number of times), it is possible to form a laminate film (hereinafter also referred to as a nano-laminate film) having a predetermined composition and a predetermined film thickness and in which the non-borazine-based BCN film and the borazine-based BCN film are alternately laminated at a nano level on the wafer 200. The laminate film as an entire film becomes a film that contains boron, carbon and nitrogen and has the borazine ring structure, that is, the borazine-based BCN film. Also, the cycle is preferably repeated a plurality of times. That is, a thickness of the BCN layer to be formed in each cycle is set to be smaller than a desired film thickness and the cycle is preferably repeated a plurality of times to obtain the desired film thickness.

[Purging and Restoring to Atmospheric Pressure]

When a film formation process of forming a laminate film having a predetermined composition and a predetermined film thickness is performed, the valves 243e to 243h are opened, and $N_2$ gas serving as the inert gas is supplied into the process chamber 201 through each of the gas supply pipes 232e to 232h and is exhausted through the exhaust pipe 231. $N_2$ gas serves as the purge gas. Therefore, the inside of the process chamber 201 is purged by the inert gas and a gas remaining in the process chamber 201 or reaction by-products are removed from the inside of the process chamber 201 (purge). Then, an atmosphere in the process chamber 201 is replaced with the inert gas (inert gas replacement), and the pressure in the process chamber 201 is restored to a normal pressure (restoration to atmospheric pressure).

[Boat Unloading and Wafer Discharge]

Then, the seal cap 219 is lowered by the boat elevator 115, the lower end of the reaction tube 203 is opened and the processed wafer 200 is unloaded (boat unloading) to the outside of the reaction tube 203 through the lower end of the reaction tube 203 while being held on the boat 217. Then, the processed wafer 200 is extracted from the boat 217 (wafer discharge).

(3) Effects of the Present Embodiment

According to the present embodiment, one or a plurality of effects to be described will be obtained.

(a) According to the present embodiment, when the first film and the second film are alternately laminated, it is possible to increase controllability a composition ratio of a finally formed BCN film (the laminate film in which the non-borazine-based BCN film and the borazine-based BCN film are alternately laminated at a nano level).

That is, a ratio between the boron component and the nitrogen component included in the second film that is formed using $BCl_3$ gas and TMB gas, for example, a ratio (hereinafter also referred to as a B/N ratio) of the boron component to the nitrogen component is determined by a ratio (1/1 in TMB gas) of the boron component with respect to the nitrogen component included in TMB gas and the boron component included in $BCl_3$ gas. It is difficult to perform control such that the ratio is set to be largely different from this value. That is, the B/N ratio of the second film is normally greater than 1 and does not easily fall below 1.

On the other hand, the B/N ratio of the first film formed using $BCl_3$ gas and TEA gas may be freely controlled by regulating flow rate ratios of $BCl_3$ gas and TEA gas. Accordingly, when the first film and the second film are alternately laminated, B/N ratios of the first film and the second film are set to be different, and thus the B/N ratio of the finally formed BCN film may be controlled to be any value between the B/N ratio of the first film and the B/N ratio of the second film. For example, it is possible to set the B/N ratio of the finally formed BCN film to be 1 or less.

Also, in the present embodiment, when the first film and the second film are alternately laminated, the carbon concentration of the first film and the carbon concentration of the second film are set to be different, and thus the carbon concentration of the finally formed BCN film may be controlled to be any concentration between the carbon concentration of the first film and the carbon concentration of the second film.

Also, when the nitriding gas is used instead of the amine-based gas as the second process gas, the first film without carbon and the second film containing carbon are alternately laminated, and thus the carbon concentration of the finally formed BCN film (the laminate film in which the non-borazine-based BN film and the borazine-based BCN film are alternately laminated at a nano level) may be controlled to be any concentration less than the carbon concentration of the second film. Also, in this case, when a ratio of a film thickness of the first film and a film thickness of the second film is controlled, it is possible to finely regulate the carbon concentration of the finally formed BCN film.

When the first film and the second film are alternately laminated in this manner, a composition ratio of the finally formed BCN film can be controlled to be a value that is unachievable when a single film is formed using $BCl_3$ gas and TMB gas or when a single film is formed using $BCl_3$ gas and TEA gas. That is, it is possible to increase a control window of the composition ratio.

(b) According to the present embodiment, when the first film and the second film are alternately laminated, it is possible to increase a film density of the finally formed BCN film, that is, controllability of an atomic density of the film. As a result, it is possible to increase controllability of a dielectric constant of the BCN film. That is, the second film (porous film) having the borazine ring structure has a lower dielectric constant than the first film (nonporous film) having no borazine ring structure. Accordingly, when the first film and the second film are alternately laminated, the dielectric constant of the finally formed BCN film can be controlled to be, for example, any value between a dielectric constant of the BCN film (single film) that has the borazine ring structure and is formed using $BCl_3$ gas and TMB gas and a dielectric constant of the BCN film (single film) that has no borazine ring structure and is formed using $BCl_3$ gas, TEA gas and the like. That is, when the first film and the second film are alternately laminated, the dielectric constant of the finally formed BCN film may be set as a value that is unachievable when a single film is formed using $BCl_3$ gas and TMB gas or when a single film is formed using $BCl_3$ gas, TEA gas and the like. Therefore, it is possible to increase a control window of the dielectric constant.

(c) According to the present embodiment, when the first film and the second film are alternately laminated, it is possible to improve surface roughness of the finally formed BCN film. The term "surface roughness" refers to a height difference within planes of the wafer or within planes of any target and has the same meaning as surface irregularity. The phrase "surface roughness is improved (good)" means that "a height difference decreases (is smaller)," that is, "a surface becomes smooth (flat)." The phrase "surface roughness is degraded (bad)" means that "a height difference increases (is larger)," that is, "a surface becomes rough (coarse)." The first film having no borazine ring structure tends to have better surface roughness than the second film having the borazine ring structure. Therefore, when the first film and the second film are alternately laminated, it is possible to improve surface roughness of the finally formed BCN film. That is, when the first film and the second film are alternately laminated, it is possible to improve surface roughness of the finally formed BCN film, compared to when the BCN film (single film) having the borazine ring structure is formed using $BCl_3$ gas and TMB gas.

In this case, when formation of the first film is performed before formation of the second film, it is possible to further improve surface roughness of the finally formed BCN film. That is, when the first film having good surface roughness is formed on the wafer as a base of the formation before the second film is formed, the second film formed thereon is influenced by the base and surface roughness thereof may be improved. As a result, it is possible to further improve surface roughness of the finally formed BCN film.

Also, in this case, when the finally formed film is set as the first film, it is possible to further improve surface roughness of the finally formed BCN film. That is, when the top portion of the finally formed BCN film is formed by the first film having good surface roughness, it is possible to further improve surface roughness of the finally formed BCN film.

(d) According to the present embodiment, when the first film and the second film are alternately laminated, it is possible to increase controllability of oxidation resistance of the finally formed BCN film. That is, the second film having the borazine ring structure includes boron as an element of the borazine ring structure forming the film. As described above, a B—N bond forming the borazine ring structure has a strong bond. Accordingly, the second film becomes a film that has less desorption of boron from the film due to oxidation and higher oxidation resistance, for example, higher resistance to oxygen plasma, than the first film having no borazine ring structure, that is, becomes a film having high ash resistance. When the first film and the second film are alternately laminated, oxidation resistance of the finally formed BCN film can be controlled to be, for example, any characteristic between the first film and the second film. That is, when the first film and the second film are alternately laminated, oxidation resistance of the finally formed BCN film can be controlled to be a characteristic that is unachievable when a single film is formed using $BCl_3$ gas and TMB gas or when a single film is formed using $BCl_3$ gas and TEA gas. That is, it is possible to increase a window of oxidation resistance control, that is, ash resistance control.

(e) According to the present embodiment, when the first film and the second film are alternately laminated, the finally formed BCN film may be a film having either or both characteristics of the first film and the second film, a film having an intermediate characteristic of the first film and the second film, or a film having a different characteristic from the first film and the second film. In this case, as described above, film thicknesses of the first film and the second film are preferably set to, for example, 5 nm or less, and preferably 1 nm or less. When any of the first film and the second film has a film thickness of greater than 5 nm, the finally formed BCN film may become a film having a non-unified characteristic in a lamination direction, that is, a film in which the first film and the second film are simply laminated and characteristics thereof are separated in the lamination direction. When film thicknesses of the first film and the second film are set to 5 nm or less, and preferably 1 nm or less, the finally formed BCN film may become a film having a consistent characteristic in the lamination direction, that is, a film in which characteristics and properties of the first film and the second film are appropriately merged. That is, when film thicknesses of the first film and the second film are set to 5 nm or less, and preferably 1 nm or less, the finally formed BCN film may be a nanolaminate film having an integral characteristic as an entire film. Also, when the number of times the above set is performed ($m_1$ times and $m_2$ times) is set to once to 10 times, film thicknesses of the first film and the second film may be set to 5 nm or less, and preferably 1 nm or less. Also, as film thicknesses of the first film and the second film become smaller, that is, as the number of times the above set is performed ($m_1$ times and $m_2$ times) becomes smaller, it is possible to improve surface roughness of the finally formed BCN film.

(f) According to the present embodiment, when the process of supplying $BCl_3$ gas to the wafer 200 and the process of supplying TEA gas to the wafer 200 are alternately performed a predetermined number of times, it is possible to increase productivity when the BCN film is formed. That is, in a film formation sequence of the related art, when the BCN film is formed, it is necessary to alternately supply at least three types of gases, a gas containing boron, a gas containing carbon and a gas containing nitrogen, to the wafer 200. On the other hand, in the film formation sequence of the present embodiment, when two types of gases, $BCl_3$ gas and TEA gas, are alternately supplied to the wafer 200, the BCN film may be formed. Accordingly, it is possible to simplify gas supply control and decrease the number of processes of gas supply for a cycle, and thus it is possible to increase productivity when the film is formed. Also, the number of types of gases required for film formation may decrease, a configuration of the gas supply system may be simplified and the number of nozzles may decrease. Therefore, a device cost may be reduced and maintenance becomes easy.

(g) According to the present embodiment, since the process of supplying $BCl_3$ gas to the wafer 200 and the process of supplying TEA gas to the wafer 200 are alternately performed a predetermined number of times, it is possible to form a boron-rich and carbon-rich BCN film on the wafer 200. That is, compared to a film formation sequence in which three types of gases, a gas containing boron, a gas containing carbon and a gas containing nitrogen, are alternately supplied to the wafer 200, in the film formation sequence of the present embodiment, boron and carbon may be sufficiently fixed onto the wafer 200 while the BCN film is formed, and desorption of these elements from the wafer 200 may be sufficiently suppressed. As a result, it is possible to form the BCN film having a high carbon concentration.

(h) According to the present embodiment, according to the number of carbon atoms with respect to the number of nitrogen atoms included in the reactive gas, that is, by appropriately selecting a gas type of the reactive gas, it is possible to regulate the carbon concentration of the BCN film. For example, when the amine-based gas that is formed of the three elements carbon, nitrogen and hydrogen and includes a greater number of carbon atoms than nitrogen atoms in its composition formula (in a molecule) is used as the reactive gas, it is possible to increase the carbon concentration of the BCN film.

In particular, when the amine-based gas that includes a plurality of ligands containing carbon atoms in its composition formula (in a molecule) is used as the reactive gas, that is, when the amine-based gas that includes a plurality of hydrocarbon groups such as an alkyl group in its composition formula (in a molecule) is used, it is possible to increase the carbon concentration of the BCN film. Specifically, when TEA gas, TMA gas, TPA gas, TIPA gas, TBA gas or TIBA gas that includes three ligands (hydrocarbon groups such as an alkyl group) containing carbon atoms in its composition formula (in a molecule) or DEA gas, DMA gas, DPA gas, DIPA gas, DBA gas or DIBA gas that includes two ligands (hydrocarbon groups such as an alkyl group) containing carbon atoms in its composition formula (in a molecule) is used as the reactive gas, it is possible to increase the carbon concentration of the BCN film.

(i) According to the present embodiment, according to the number of ligands (the number of hydrocarbon groups such as an alkyl group) containing carbon atoms included in the reactive gas, that is, by appropriately changing a gas type of the reactive gas, it is possible to finely regulate the cycle rate (a thickness of the BCN layer to be formed per unit cycle) or the nitrogen concentration or the carbon concentration of the BCN film.

For example, when the amine-based gas that includes two ligands containing carbon atoms in its composition formula (in a molecule) such as DEA gas is used as the reactive gas, it is possible to further increase the cycle rate and further increase a ratio (a ratio of nitrogen concentration to carbon concentration) of the nitrogen concentration with respect to the carbon concentration of the BCN film than when the amine-based gas that includes three ligands containing carbon atoms in its composition formula (in a molecule) such as TEA gas is used.

Also, for example, when the amine-based gas that includes three ligands containing carbon atoms in its composition formula (in a molecule) such as TEA gas is used as the reactive gas, it is possible to further increase a ratio (a ratio of carbon concentration to nitrogen concentration) of the carbon concentration with respect to the nitrogen concentration of the BCN film than when the amine-based gas that includes two ligands containing carbon atoms in its composition formula (in a molecule) such as DEA gas is used.

(j) According to the present embodiment, by controlling the pressure in the process chamber 201 when the reactive gas is supplied, it is possible to finely regulate the carbon concentration in the BCN film.

For example, the pressure in the process chamber 201 when TEA gas is supplied to the wafer 200 in step S2a is set to be higher than the pressure in the process chamber 201 when $BCl_3$ gas is supplied to the wafer 200 in step S1a. Therefore, it is possible to further increase the carbon concentration of the BCN film.

Also, for example, the pressure in the process chamber 201 when TEA gas is supplied to the wafer 200 in step S2a is set to be equal to or lower than the pressure in the process chamber 201 when $BCl_3$ gas is supplied to the wafer 200 in step S1a. Therefore, it is possible to appropriately suppress an increment of the carbon concentration of the BCN film.

Also, when the boron concentration, the carbon concentration or the nitrogen concentration of the BCN film is regulated, it is possible to control HF or hot phosphoric acid resistance of the BCN film. For example, when the boron concentration and the carbon concentration of the BCN film increase, it is possible to increase HF resistance more than in the BN film. When the boron concentration and the carbon concentration of the film decrease, it is possible to decrease HF resistance more than in the BN film or HF resistance may be close to that of the BN film. Also, for example, when the nitrogen concentration of the BCN film increases, hot phosphoric acid resistance may decrease, compared to the BN film. When the nitrogen concentration of the film decreases, hot phosphoric acid resistance may increase compared to the BN film or may be close to that of the BN film. Also, for example, when the carbon concentration of the BCN film increases, hot phosphoric acid resistance may increase compared to the BN film.

(k) According to the present embodiment, when TEA gas that is the boron-free and metal-free amine-based gas formed of the three elements carbon, nitrogen and hydrogen is used as the reactive gas, it is possible to decrease a concentration of impurities of the BCN film to be formed. That is, compared to a film formation sequence in which for example, tetrakisethylmethylaminohafnium ($Hf[N(C_2H_5)(CH_3)]_4$, abbreviation: TEMAH) gas formed of the four elements hafnium (Hf), carbon, nitrogen and hydrogen is used as the reactive gas, in the film formation sequence of the present embodiment in which TEA gas is used as the reactive gas, it is possible to decrease a probability of impurity elements being mixed into the second layer that is formed by a reaction of the first layer with the reactive gas, and it is possible to decrease a concentration of impurities of the BCN film to be formed.

(l) According to the present embodiment, when TEA gas that is the boron-free and metal-free amine-based gas formed of the three elements carbon, nitrogen and hydrogen is used as the reactive gas, and when the film formation sequence in which $BCl_3$ gas and TEA gas are alternately supplied to the wafer 200 is used, it is possible to increase reaction controllability when the BCN film is formed, and particularly, increase composition controllability. That is, for example, compared to a film formation sequence in which TEMAH gas formed of the four elements Hf, carbon, nitrogen and hydrogen or the like is used as the reactive gas, in the film formation sequence of the present embodiment in which TEA gas is used as the reactive gas, the reactive gas and the first layer react, and thus it is possible to increase reaction controllability when the second layer is formed, and particularly, increase composition controllability. Also, compared to the film formation sequence in which three types of gases, a gas containing boron, a gas containing carbon and a gas containing nitrogen, are alternately supplied to the wafer 200, in the film formation sequence of the present embodiment in which two types of gases, $BCl_3$ gas and TEA gas, are alternately supplied to the wafer 200, it is possible to increase reaction controllability while the BCN film is formed, and particularly, increase composition controllability. Therefore, it is possible to easily control the composition of the BCN film. As a result, it is possible to increase etch resistance of the BCN film to be formed or regulate the dielectric constant.

(m) According to the present embodiment, when TEA gas that is the boron-free and metal-free amine-based gas formed of the three elements carbon, nitrogen and hydrogen is used as the reactive gas, it is possible to increase film thickness uniformity within and between planes of the wafers 200 of the BCN film. That is, for example, compared to TEMAH gas formed of the four elements Hf, carbon, nitrogen and hydrogen and the like, since TEA gas formed of the three elements carbon, nitrogen and hydrogen has high reactivity with the first layer, in the film formation sequence of the present embodiment in which TEA gas is used as the reactive gas, a reaction of the first layer with the reactive gas may be reliably and uniformly performed within and between planes of the wafers 200. As a result, it is possible to increase film thickness uniformity within and between planes of the wafers 200 of the BCN film.

(n) According to the film formation sequence of the present embodiment, when the cycle including steps S3a and S4a is performed a predetermined number of times, it is possible to form the BCN film having a high HF resistance and a low dielectric constant on the wafer 200 in a low temperature range, compared to a SiCN film, a SiOCN film or the like of the related art. That is, it is possible to form a thin film capable of achieving an increase in HF resistance and a decrease in a dielectric constant, which have a trade-off relation, in a low temperature range.

(o) According to the film formation sequence of the present embodiment, after $BCl_3$ gas is supplied to form the third layer in step S3a, TMB gas is supplied and the third layer is modified to the fourth layer in step S4a. Therefore, it is possible to easily control the composition of the borazine-based BCN film and thus it is possible to form the borazine-based BCN film having a desired characteristic.

In particular, according to the film formation sequence of the present embodiment, when two processes, the process of supplying $BCl_3$ gas serving as a first boron source and the process of supplying TMB gas serving as a second boron source, are performed during a cycle, that is, when two types of boron sources (double boron sources) are used for film formation during a cycle, it is possible to newly add the boron component included in TMB gas into the BCN film, in addition to the boron component included in $BCl_3$ gas. That is, compared to a case in which one type of boron source (single boron source) is used for film formation during a cycle, it is possible to increase the boron concentration of the BCN film.

(p) According to the film formation sequence of the present embodiment, a gas (TMB gas) containing the borazine compound having high reducibility and high reactivity with a halogen element such as chlorine is used as the reactive gas. Accordingly, since the third layer may efficiently react with the reactive gas in step S4a, the fourth layer may be efficiently formed. Therefore, it is possible to increase productivity of the film formation process of the BCN film.

(q) According to the film formation sequence of the present embodiment, when two types of gases, $BCl_3$ gas and TMB gas, are used, it is possible to form the BCN film including the three elements boron, carbon and nitrogen. That is, there is no need to separately supply a boron source, a nitrogen source and a carbon source when the film is formed. Accordingly, a time required for a cycle may decrease and productivity of the film formation process may further increase. Also, when the number of types of gases required for film formation is decreased, a configuration of the gas supply system may be simplified and the number of nozzles may decrease. Therefore, a device cost may be reduced and maintenance becomes easy.

(r) According to the film formation sequence of the present embodiment, when the fourth layer is formed, the borazine ring structure forming the borazine ring included in the borazine compound (TMB) is preserved without breaking Therefore, the BCN film may become a porous film and the dielectric constant of the film may further decrease. That is, a low dielectric constant film (low-k film) that has a porous structure and has an extremely low dielectric constant may be formed.

Also, according to the film formation sequence of the present embodiment, for example, if the temperature of the wafer is further increased or the pressure in the process chamber is increased more than that of the process conditions when the fourth layer is formed, at least a part of the borazine ring structure forming the borazine ring included in the borazine compound (TMB) is not preserved but is destroyed. Therefore, it is possible to eliminate a center space of the borazine ring. Accordingly, a state (density) of the borazine ring structure of the BCN film, that is, a porous state (density) of the BCN film, may be changed and thus it is possible to finely regulate the dielectric constant of the BCN film.

According to the film formation sequence of the present embodiment in this manner, by changing a state of the borazine ring structure of the BCN film, that is, by preserving the borazine ring structure or destroying at least a part thereof, it is possible to control the dielectric constant of the BCN film. Also, by changing a state of the borazine ring structure of the film, it is possible to control film stress.

(s) According to the film formation sequence of the present embodiment, when the third layer reacts with TMB gas in step S4a, it is possible to extract or desorb impurities such as chlorine from the third layer. As a result, since a concentration of impurities of the BCN film may decrease, it is possible to further increase HF resistance of the BCN film.

Even when $BCl_3$ gas and TEA gas are simultaneously supplied, the same effects as in the above embodiment may be obtained. However, it is preferable to alternately perform supply of $BCl_3$ gas and supply of TEA gas while purging the inside of the process chamber 201 therebetween as in the above embodiment so that $BCl_3$ gas and TEA gas may appropriately react under a condition in which a surface reaction is dominant, and controllability of film thickness control may increase.

Also, when $BCl_3$ gas and TMB gas are simultaneously supplied, the same effects as in the above embodiment may be obtained. However, it is preferable to alternately perform supply of $BCl_3$ gas and supply of TMB gas while purging the inside of the process chamber 201 therebetween as in the above embodiment so that $BCl_3$ gas and TMB gas may appropriately react under a condition in which a surface reaction is dominant, and controllability of film thickness control may increase.

<Second Embodiment of the Present Invention>

Next, the second embodiment will be described with reference to FIGS. 5A and 5B.

The first embodiment has exemplified the case in which the first set including steps S1a and S2a is performed a predetermined number of times to form the non-borazine-based BCN film on the wafer 200 in the process of forming the first film, the second set including steps S3a and S4a is performed a predetermined number of times to form the borazine-based BCN film on the non-borazine-based BCN film in the process of forming the second film, and the cycle including the process of forming the first film and the process of forming the second film is performed a predetermined number of times to form the laminate film. The present embodiment has a different process of forming the second film from the first embodiment. In the process of forming the second film of the present embodiment, a second set in which step S5b of supplying the nitriding gas to the wafer 200 is further included in addition to steps S3b and S4b that are the same as steps S3a and S4a is performed a predetermined number of times to form the borazine-based BCN film or the borazine-based BN film. Here, as the nitriding gas, for example, ammonia ($NH_3$) gas may be used.

That is, in the present embodiment, a laminate film in which the non-borazine-based BCN film and the borazine-based BCN film or the borazine-based BN film are laminated is formed on the wafer 200 by performing a cycle a predetermined number of times under a condition in which the borazine ring structure of the organic borazine-based gas (TMB gas) serving as the fourth process gas is preserved. The cycle includes the process of forming the non-borazine-based BCN film as the first film by performing a first set a predetermined number of times, wherein the first set includes the process of supplying the chloroborane-based source gas ($BCl_3$ gas) as the first process gas free of the borazine ring structure and including boron to the wafer 200 and the process of supplying the amine-based gas (TEA gas) as the second process gas including nitrogen or nitrogen and carbon to the wafer 200; and the process of forming the borazine-based BCN film or the borazine-based BN film as the second film by performing a second set a predetermined number of times, wherein the second set includes the process of supplying the chloroborane-based source gas ($BCl_3$ gas) as the third process gas to the wafer 200, the process of supplying the organic borazine-based gas (TMB gas) as the fourth process gas that includes borazine ring structure and the organic ligand to the wafer 200, and the process of supplying the nitriding gas ($NH_3$ gas) to the wafer 200.

The present sequence is the same as the film formation sequence of the first embodiment except that step S5b is further included in addition to steps S1b, S2b, S3b and S4b that are the same as steps S1a, S2a, S3a and S4a. Hereinafter, step S5b of the present embodiment will be described.

[Step S5b]

($NH_3$ Gas Supply)

Step S4b ends, the residual gas in the process chamber 201 is removed, and then the valve 243c is opened to flow $NH_3$ gas into the gas supply pipe 232c. $NH_3$ gas has a flow rate that is regulated by the MFC 241c and is supplied into the buffer chamber 237 through the gas supply hole 250c. In this case, when no high frequency power is applied between the rod-shaped electrodes 269 and 270, $NH_3$ gas supplied into the buffer chamber 237 is thermally activated, supplied into the process chamber 201 through the gas supply hole 250e and exhausted through the exhaust pipe 231 (refer to FIG. 5A). Also, in this case, when high frequency power is applied between the rod-shaped electrodes 269 and 270 from the high frequency power source 273 through the matching unit 272, $NH_3$ gas supplied into the buffer chamber 237 is excited to plasma, supplied into the process chamber 201 as an active species through the gas supply hole 250e and exhausted through the exhaust pipe 231 (refer to FIG. 5B). In this case, NH₃ gas that is thermally activated or activated to plasma is supplied to the wafer 200. In this case, at the same time, the valve 243g is opened to flow N₂ gas into the gas supply pipe 232g. N₂ gas is supplied into the process chamber 201 along with NH₃ gas and exhausted through the exhaust pipe 231.

In this case, in order to prevent NH₃ gas from being introduced into the nozzles 249a, 249b and 249d, the valves 243e, 243f and 243h are opened to flow N₂ gas into the gas supply pipes 232e, 232f and 232h. N₂ gas is supplied into the process chamber 201 through the gas supply pipes 232a, 232b and 232d and the nozzles 249a, 249b and 249d and is exhausted through the exhaust pipe 231.

When NH₃ gas is not excited to plasma, but is thermally activated and flows, by appropriately adjusting the APC valve 244, a pressure in the process chamber 201 is set to, for example, a pressure in a range of 1 Pa to 3,000 Pa. When the pressure in the process chamber 201 is set to a relatively high pressure range in this manner, it is possible to thermally activate NH₃ gas to non plasma. When NH₃ gas is thermally activated and then supplied, since a relatively soft reaction may be caused, nitration to be described below may be softly performed. A partial pressure of NH₃ gas in the process chamber 201 is set to, for example, a pressure in a range of 0.01 Pa to 2,970 Pa. A supply flow rate of NH₃ gas controlled by the MFC 241c is set to, for example, a flow rate in a range of 100 sccm to 10,000 sccm. A supply flow rate of N₂ gas controlled by each of the MFCs 241e to 241h is set to, for example, a flow rate in a range of 100 sccm to 10,000 sccm. A time for which thermally activated NH₃ gas is supplied to the wafer 200, that is, a gas supply time (radiation time) is set to, for example, a time in a range of 1 to 120 seconds, and preferably 1 to 60 seconds. Similar to steps S3b and S4b, the temperature of the heater 207 in this case is set such that the temperature of the wafer 200 is set to, for example, a temperature in a range of 250° C. to 700° C., preferably 300° C. to 650° C., and more preferably 350° C. to 600° C.

When NH₃ gas is excited to plasma and flows as an active species, by appropriately adjusting the APC valve 244, the pressure in the process chamber 201 is set to, for example, a pressure in a range of 1 Pa to 100 Pa. A partial pressure of NH₃ gas in the process chamber 201 is set to, for example, a pressure in a range of 0.01 Pa to 100 Pa. A supply flow rate of NH₃ gas controlled by the MFC 241c is set to, for example, a flow rate in a range of 100 sccm to 10,000 sccm. A supply flow rate of N₂ gas controlled by each of the MFCs 241e to 241h is set to, for example, a flow rate in a range of 100 sccm to 10,000 sccm. A time for which an active species obtained by exciting NH₃ gas to plasma is supplied to the wafer 200, that is, a gas supply time (radiation time), is set to, for example, a time in a range of 1 to 120 seconds, and preferably 1 to 60 seconds. Similar to steps S3b and S4b, the temperature of the heater 207 in this case is set such that the temperature of the wafer 200 is set to, for example, a temperature in a range of 250° C. to 700° C., preferably 300° C. to 650° C., and more preferably 350° C. to 600° C. High frequency power applied between the rod-shaped electrodes 269 and 270 from the high frequency power source 273 is set to, for example, power in a range of 50 W to 1,000 W.

In this case, a gas flowing in the process chamber 201 is NH₃ gas that is thermally activated by increasing the pressure in the process chamber 201 or an active species obtained by exciting NH₃ gas to plasma. Neither BCl₃ gas nor TEA gas flows in the process chamber 201. Therefore, NH₃ gas may not cause a gas-phase reaction and activated NH₃ gas or NH₃ gas that has become an active species reacts with at least a part of the fourth layer formed on the wafer 200 in step S4b. Therefore, the fourth layer is nitrided and modified to a fifth layer (BCN layer) containing boron, carbon and nitrogen or a fifth layer (BN layer) containing boron and nitrogen. The fifth layer becomes, for example, a layer having a thickness of less than one atomic layer to several atomic layers.

In the process of forming the fifth layer, the fourth layer is nitrided by the nitriding gas, and thus the fourth layer is modified. That is, due to nitration of the fourth layer, nitrogen is further included in the fourth layer. Also, due to nitration of the fourth layer, at least some carbon included in the fourth layer is separated (extracted) from the fourth layer. That is, the fifth layer has a higher nitrogen concentration than the fourth layer, and the fifth layer has a lower carbon concentration than the fourth layer.

Figure 5A:
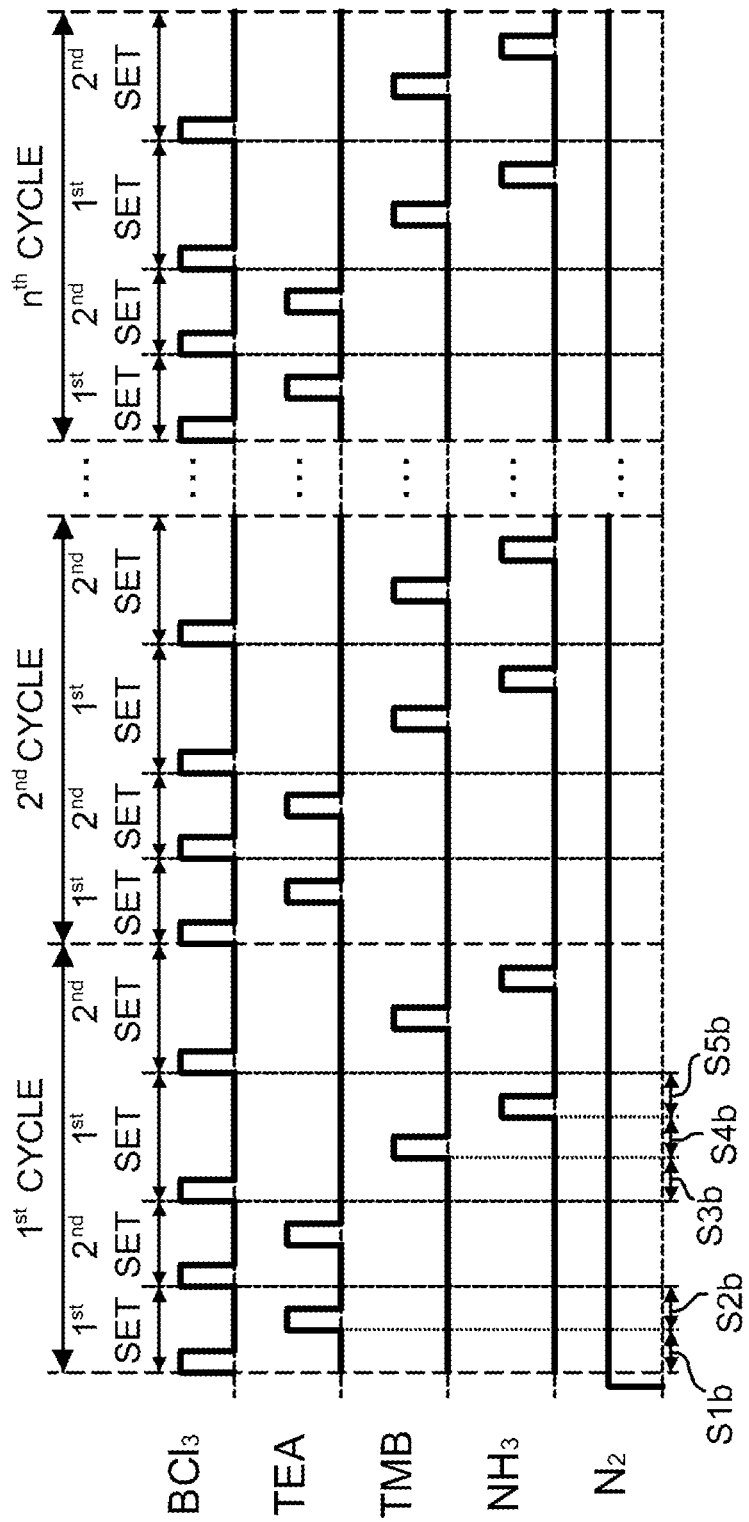
FIGS. 5A and 5B are diagrams illustrating gas supply and high frequency power supply timings in a film formation sequence of a second embodiment.

As illustrated in FIG. 5A, when NH₃ gas is thermally activated and then flows in the process chamber 201, the fourth layer may be thermally nitrided and modified (changed) to the fifth layer. In this case, while a ratio of the nitrogen component in the fourth layer is increased, when at least a part of the carbon component in the fourth layer is desorbed (extracted) due to energy of activated NH₃ gas, the fourth layer is modified to the fifth layer. In this case, according to an effect of thermal nitration by NH₃ gas, B—N bonds in the fourth layer increase, whereas B—C bonds and B—B bonds decrease, and a ratio of the carbon component and a ratio of the boron component in the fourth layer decrease. In particular, most of the carbon component may be desorbed to be reduced to an impurity level. That is, while a composition ratio is changed such that the nitrogen concentration increases and the carbon concentration and the boron concentration decrease, the fourth layer may be modified to the fifth layer. Also, in this case, by controlling process conditions such as the pressure in the process chamber 201 or the gas supply time, a ratio of the nitrogen component in the fifth layer, that is, the nitrogen concentration, may be finely regulated. Therefore, it is possible to control a composition ratio of the fifth layer more precisely.

Figure 5B:
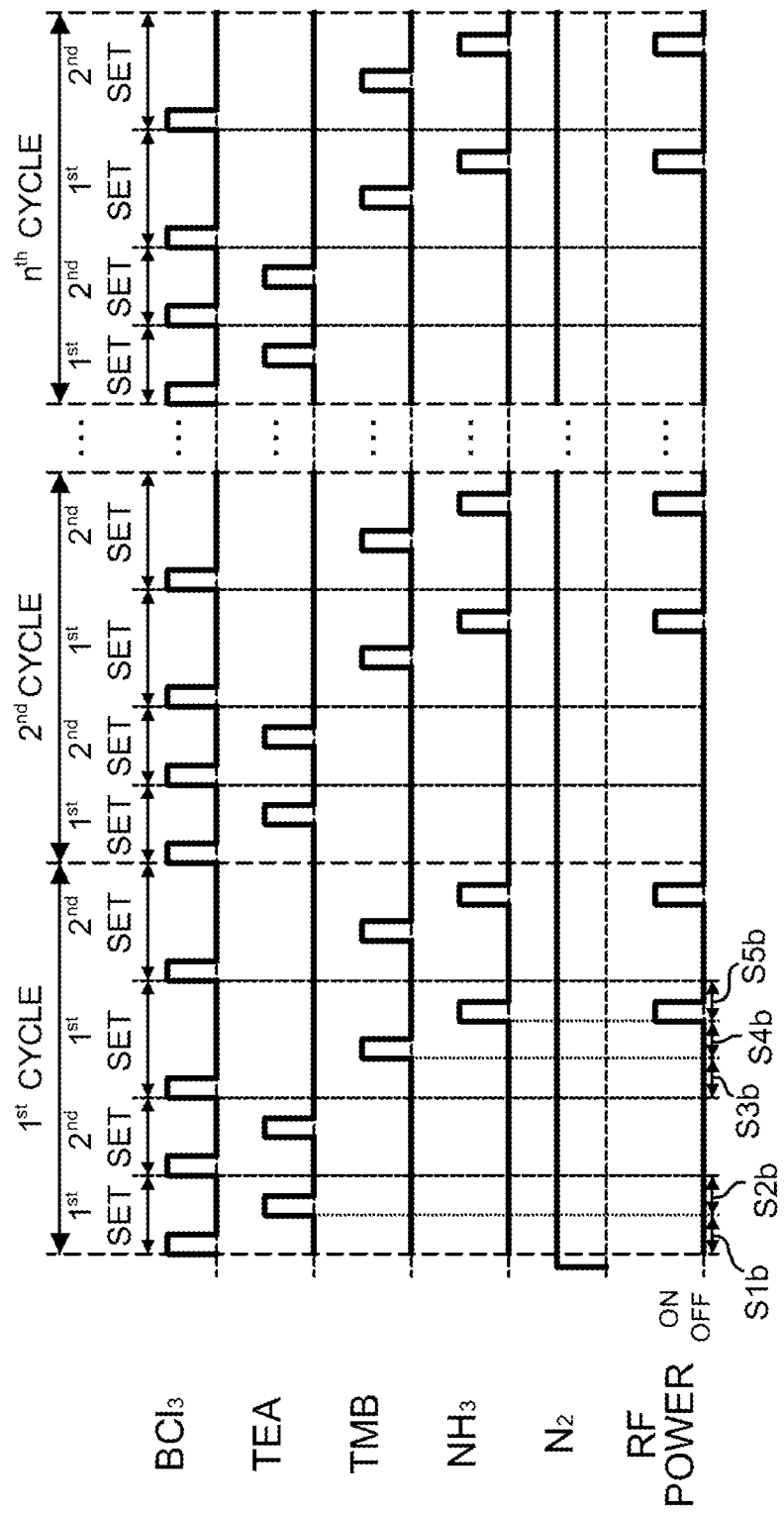

Also, as illustrated in FIG. 5B, when an active species obtained by exciting NH₃ gas to plasma flows in the process chamber 201, the fourth layer may be plasma-nitrided and modified (changed) to the fifth layer. In this case, while a ratio of the nitrogen component in the fourth layer is increased, when at least some of the carbon component in the fourth layer is desorbed (extracted) due to energy of an active species, the fourth layer is modified (changed) to the fifth layer. In this case, according to an effect of plasma nitration by NH₃ gas, B—N bonds in the fourth layer increase, whereas B—C bonds and B—B bonds decrease, and a ratio of the carbon component and a ratio of the boron component in the fourth layer decrease. In particular, most of the carbon component may be desorbed to be reduced to an impurity level or may be substantially eliminated. That is, while a composition ratio is changed such that the nitrogen concentration increases and the carbon concentration and the boron concentration decrease, the fourth layer may be modified to the fifth layer. Also, in this case, by controlling process conditions such as the pressure in the process chamber 201 or the gas supply time, a ratio of the nitrogen component in the fifth layer, that is, the nitrogen concentration, may be finely regulated. Therefore, it is possible to control a composition ratio of the fifth layer more precisely.

In this case, the fourth layer is preferably not saturated with the nitriding reaction. For example, when the fourth layer having a thickness of less than one atomic layer to several atomic layers is formed in steps S3b and S4b, a part of the fourth layer is preferably nitrided. In this case, nitration is performed under a condition in which the fourth layer is not saturated with the nitriding reaction such that the entire fourth layer having a thickness of less than one atomic layer to several atomic layers is not nitrided.

In order not to saturate the fourth layer with the nitriding reaction, the process conditions in step S5b may be set as the above process conditions. Also, when the process conditions in step S5b are set as the following process conditions, it is easy to not saturate the fourth layer with the nitriding reaction.

[When NH₃ Gas is Thermally Activated and Flows]

Wafer temperature: 500° C. to 650° C., pressure in the process chamber: 133 Pa to 2,666 Pa, partial pressure of NH₃ gas: 33 Pa to 2,515 Pa, supply flow rate of NH₃ gas: 1,000 sccm to 5,000 sccm, supply flow rate of N₂ gas: 300 sccm to 3,000 sccm, NH₃ gas supply time: 6 to 60 seconds

[When NH₃ Gas is Activated to Plasma and Flows]

Wafer temperature: 500° C. to 650° C., pressure in the process chamber: 33 Pa to 80 Pa, partial pressure of NH₃ gas: 17 Pa to 75 Pa, supply flow rate of NH₃ gas: 1,000 sccm to 5,000 sccm, supply flow rate of N₂ gas: 300 sccm to 1,000 sccm, NH₃ gas supply time: 6 to 60 seconds

[Residual Gas Removal]

After the fifth layer is formed, the valve 243c is closed to stop supply of NH₃ gas. In this case, while the APC valve 244 is opened, the inside of the process chamber 201 is vacuum-exhausted by the vacuum pump 246 and an unreacted gas remaining in the process chamber 201, NH₃ gas that has contributed to formation of the fifth layer or reaction by-products are removed from the inside of the process chamber 201. In this case, while the valves 243e to 243h are opened, supply of N₂ gas into the process chamber 201 continues. N₂ gas serves as the purge gas. Therefore, it is possible to increase an effect of removing an unreacted gas remaining in the process chamber 201, NH₃ gas that has contributed to formation of the fifth layer or reaction by-products from the inside of the process chamber 201.

In this case, a gas remaining in the process chamber 201 may not be completely removed and the inside of the process chamber 201 may not be completely purged, similar to the above embodiment.

As the nitriding gas (nitrogen-containing gas), in addition to NH₃ gas, diazene (N₂H₂) gas, hydrazine (N₂H₄) gas, N₃H₈ gas or a gas containing a compound thereof may be used. As the inert gas, in addition to N₂ gas, rare gases such as Ar gas, He gas, Ne gas and Xe gas may be used.

[Performing a Predetermined Number of Times]

When steps S3b, S4b and S5b are set as a second set and the second set is performed once or more (a predetermined number of times), it is possible to form the borazine-based BCN film or the borazine-based BN film having a predetermined composition and a predetermined film thickness as the second film. The second set is preferably repeated a plurality of times.

That is, a cycle includes the process of forming the first film of the first embodiment and the process of forming the second film in which the above second set (steps S1b to S5b) is performed a predetermined number of times. When this cycle is performed once or more (a predetermined number of times), it is possible to form a laminate film (nanolaminate film) in which the non-borazine-based BCN film and the borazine-based BCN film or the borazine-based BN film having a predetermined composition and a predetermined film thickness are alternately laminated at a nano level on the wafer 200. The entire laminate film becomes a film that contains boron, carbon and nitrogen and has the borazine ring structure, that is, the borazine-based BCN film.

[Effects of the Present Embodiment]

According to the film formation sequence of the present embodiment, the same effects as in the first embodiment may be obtained. Also, according to the film formation sequence of the present embodiment, when step S5b of supplying NH₃ gas to the wafer 200 is performed, since a composition ratio of the borazine-based BCN film or the borazine-based BN film may be finely regulated as described above, it is possible to finely regulate the composition ratio of the finally formed nanolaminate film.

<Third Embodiment of the Present Invention>

Next, the third embodiment will be described with reference to FIG. 6.

The present embodiment has a different process of forming the second film from the first embodiment. In the process of forming the second film of the present embodiment, a second set in which step S5c of supplying the amine-based gas to the wafer 200 is further included in addition to steps S3c and S4c that are the same as steps S3a and S4a is performed a predetermined number of times to form the borazine-based BCN film having a predetermined composition and a predetermined film thickness.

In the present embodiment, a laminate film in which the non-borazine-based BCN film and the borazine-based BCN film are laminated is formed on the wafer 200 by performing a cycle a predetermined number of times under a condition in which the borazine ring structure of the organic borazine-based gas (TMB gas) serving as the fourth process gas is preserved. The cycle includes the process of forming the non-borazine-based BCN film as the first film by performing a first set a predetermined number of times, wherein the first set includes the process of supplying the chloroborane-based source gas (BCl₃ gas) as the first process gas free of the borazine ring structure and including boron to the wafer 200 and the process of supplying the amine-based gas (TEA gas) as the second process gas including nitrogen or nitrogen and carbon to the wafer 200; and the process of forming the borazine-based BCN film as the second film by performing a second set a predetermined number of times, wherein the second set includes the process of supplying the chloroborane-based source gas (BCl₃ gas) as the third process gas to the wafer 200, the process of supplying the organic borazine-based gas (TMB gas) as the fourth process gas that has the borazine ring structure and the organic ligand to the wafer 200, and the process of supplying the amine-based gas (TEA gas) to the wafer 200.

The present sequence is the same as the film formation sequence of the first embodiment except that step S5c is further included in addition to steps S1c, S2c, S3c and S4c that are the same as steps S1a, S2a, S3a and S4a. Also, step S5c of the present embodiment is the same as the above step S2a.

The above steps S3c to S5c are set as a second set. When the second set is performed once or more (a predetermined number of times), it is possible to form the borazine-based BCN film having a predetermined composition and a predetermined film thickness on the wafer 200 as the second film. The above second set is preferably repeated a plurality of times.

That is, a cycle includes the process of forming the first film of the first embodiment and the process of forming the second film in which the above second set (steps S3c to S5c) is performed a predetermined number of times. When this cycle is performed once or more (a predetermined number of times), it is possible to form a laminate film (nanolaminate film) in which the non-borazine-based BCN film and the borazine-based BCN film having a predetermined composition and a predetermined film thickness are alternately laminated at a nano level on the wafer 200. The entire laminate film becomes a film that contains boron, carbon and nitrogen and has the borazine ring structure, that is, the borazine-based BCN film.

<Fourth Embodiment of the Present Invention>

Next, the fourth embodiment will be described with reference to FIGS. 7A and 7B.

The present embodiment has a different process of forming the first film from the first embodiment. In the process of forming the first film of the present embodiment, a first set in which step S3$d$ of supplying the nitriding gas to the wafer 200 is further included in addition to steps S1$d$ and S2$d$ that are the same as steps S1$a$ and S2$a$ is performed a predetermined number of times to form the non-borazine-based BN film or the non-borazine-based BCN film having a predetermined composition and a predetermined film thickness.

In the present embodiment, a laminate film in which the non-borazine-based BCN film or the non-borazine-based BN film and the borazine-based BCN film are laminated is formed on the wafer 200 by performing a cycle a predetermined number of times under a condition in which the borazine ring structure of the organic borazine-based gas (TMB gas) serving as the fourth process gas is preserved. The cycle includes the process of forming the non-borazine-based BCN film or the non-borazine-based BN film as the first film by performing a first set a predetermined number of times, wherein the first set includes the process of supplying the chloroborane-based source gas (BCl$_3$ gas) as the first process gas free of the borazine ring structure and including boron to the wafer 200, the process of supplying the amine-based gas (TEA gas) as the second process gas including nitrogen or nitrogen and carbon to the wafer 200 and the process of supplying the nitriding gas (NH$_3$ gas) to the wafer 200; and the process of forming the borazine-based BCN film the second film by performing a second set a predetermined number of times, wherein the second set includes the process of supplying the chloroborane-based source gas (BCl$_3$ gas) as the third process gas to the wafer 200 and the process of supplying the organic borazine-based gas (TMB gas) as the fourth process gas that has the borazine ring structure and the organic ligand to the wafer 200.

The present sequence is the same as the film formation sequence of the first embodiment except that step S3$d$ is further included between steps S1$d$ and S2$d$ and steps S4$d$ and S5$d$ that are the same as steps S1$a$, S2$a$, S3$a$ and S4$a$. Also, step S3$d$ of the present embodiment is the same as step S5$b$ of the above second embodiment.

The above steps S1$d$ to S3$d$ are set as a first set. When the first set is performed once or more (a predetermined number of times), it is possible to form the non-borazine-based BN film or the non-borazine-based BCN film having a predetermined composition and a predetermined film thickness on the wafer 200 as the first film. The above first set is preferably repeated a plurality of times.

That is, a cycle includes the process of forming the first film in which the first set [steps S1$d$ to S3$d$] is performed a predetermined number of times and the process of forming the second film of the first embodiment. When this cycle is performed once or more (a predetermined number of times), it is possible to form a laminate film (nanolaminate film) in which the non-borazine-based BCN film or the non-borazine-based BN film and the borazine-based BCN film having a predetermined composition and a predetermined film thickness are alternately laminated at a nano level on the wafer 200. The entire laminate film becomes a film that contains boron, carbon and nitrogen and has the borazine ring structure, that is, the borazine-based BCN film.

Figure 7A:
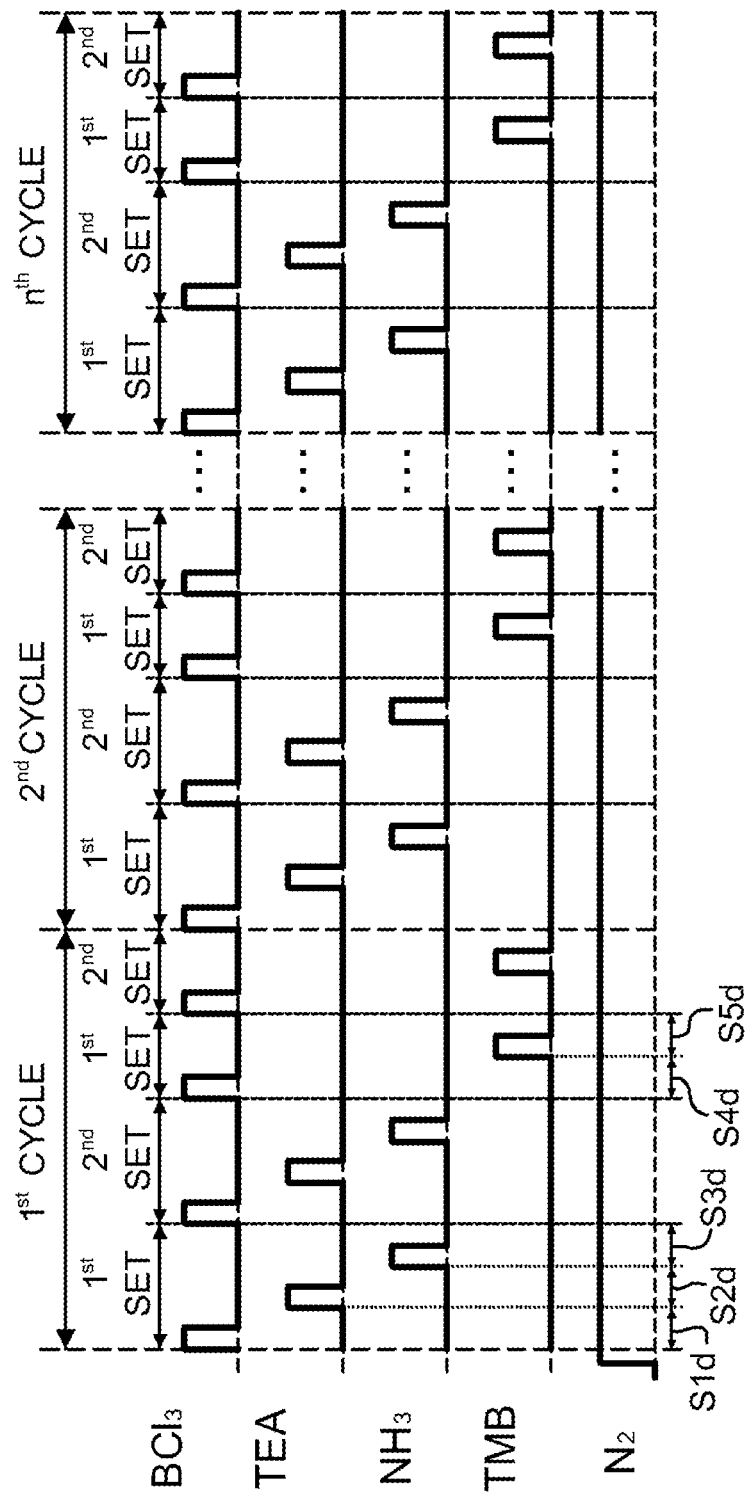
FIGS. 7A and 7B are diagrams illustrating gas supply and high frequency power supply timings in a film formation sequence of a fourth embodiment.

As illustrated in FIG. 7A, when NH$_3$ gas is thermally activated and then flows in the process chamber 201 in step S3$d$, the second layer may be thermally nitrided and modified (changed) to the BCN layer or the BN layer. In this case, while a ratio of the nitrogen component in the second layer is increased, when at least a part of the carbon component in the second layer is desorbed (extracted) due to energy of activated NH$_3$ gas, the second layer is modified to the BCN layer or the BN layer. In this case, according to an effect of thermal nitration by NH$_3$ gas, B—N bonds in the second layer increase, whereas B—C bonds and B—B bonds decrease, and a ratio of the carbon component and a ratio of the boron component in the second layer decrease. In particular, most of the carbon component may be desorbed to be reduced to an impurity level. That is, while a composition ratio is changed such that the nitrogen concentration increases and the carbon concentration and the boron concentration decrease, the second layer may be modified to the BCN layer or the BN layer. Also, in this case, by controlling process conditions such as the pressure in the process chamber 201 or the gas supply time, a ratio of the nitrogen component in the BCN layer or the BN layer, that is, the nitrogen concentration, may be finely regulated. Therefore, it is possible to control a composition ratio of the BCN layer or the BN layer more precisely.

Figure 7B:
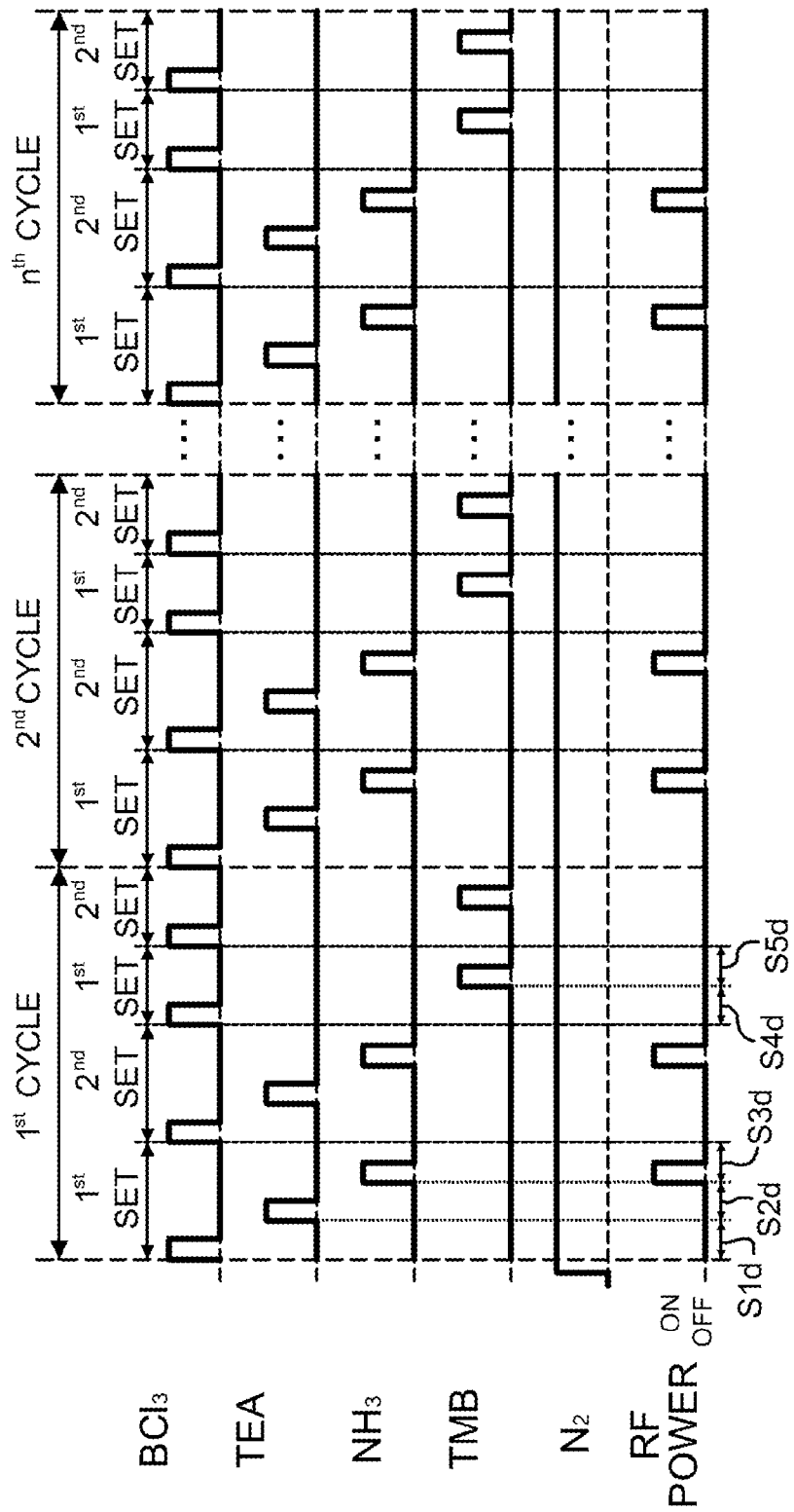

Also, as illustrated in FIG. 7B, when an active species obtained by exciting NH$_3$ gas to plasma in step S3$d$ flows in the process chamber 201, the second layer may be plasma-nitrided and modified (changed) to the BCN layer or the BN layer. In this case, while a ratio of the nitrogen component in the second layer is increased, when at least a part of the carbon component in the second layer is desorbed (extracted) due to energy of an active species, the second layer is modified (changed) to the BCN layer or the BN layer. In this case, according to an effect of plasma nitration by NH$_3$ gas, B—N bonds in the second layer increase, whereas B—C bonds and B—B bonds decrease, and a ratio of the carbon component and a ratio of the boron component in the second layer decrease. In particular, most of the carbon component may be desorbed to be reduced to an impurity level or may be substantially eliminated. That is, while a composition ratio is changed such that the nitrogen concentration increases and the carbon concentration and the boron concentration decrease, the second layer may be modified to the BCN layer or the BN layer. Also, in this case, by controlling process conditions such as the pressure in the process chamber 201 or the gas supply time, a ratio of the nitrogen component in the BCN layer or the BN layer, that is, the nitrogen concentration may be finely regulated. Therefore, it is possible to control a composition ratio of the BCN layer or the BN layer more precisely.

In this case, the second layer is preferably not saturated with the nitriding reaction. For example, when the second layer having a thickness of less than one atomic layer to several atomic layers is formed in steps S1$d$ and S2$d$, a part of the second layer is preferably nitrided. In this case, nitration is performed under a condition in which the second layer is not saturated with the nitriding reaction such that the entire second layer having a thickness of less than one atomic layer to several atomic layers is not nitrided.

<Fifth Embodiment of the Present Invention>

Next, the fifth embodiment will be described with reference to FIGS. 8A and 8B.

The present embodiment has a different process of forming the first film from the first embodiment. In the process of forming the first film of the present embodiment, after step S1$e$ that is the same as step S1$a$, step S2$e$ of supplying the nitriding gas (NH$_3$) instead of the amine-based gas as the second process gas is performed. Steps S1e and S2e are set as a first set. When the first set is performed a predetermined number of times, the non-borazine-based BN film having a predetermined composition and a predetermined film thickness is formed.

In the present embodiment, a laminate film in which the non-borazine-based BN film and the borazine-based BCN film are laminated is formed on the wafer 200 by performing a cycle a predetermined number of times under a condition in which the borazine ring structure of the organic borazine-based gas (TMB) serving as the fourth process gas is preserved. The cycle includes the process of forming the non-borazine-based BN film as the first film by performing a first set a predetermined number of times, wherein the first set includes the process of supplying the chloroborane-based source gas ($BCl_3$ gas) as the first process gas free of the borazine ring structure and including boron to the wafer 200 and the process of supplying the nitriding gas ($NH_3$ gas) as the second process gas containing nitrogen to the wafer 200; and the process of forming the borazine-based BCN film as the second film by performing a second set a predetermined number of times, wherein the second set includes the process of supplying the chloroborane-based source gas ($BCl_3$ gas) as the third process gas to the wafer 200 and the process of supplying the organic borazine-based gas (TMB gas) as the fourth process gas that has the borazine ring structure and the organic ligand to the wafer 200.

The present sequence is the same as the film formation sequence of the first embodiment except that, after step S1e that is the same as step S1a, step S2e is performed instead of step S2a, and after the first film is formed, steps S3e and S4e that are the same as steps S3a and S4a are performed. Also, step S2e of the present embodiment is the same as step S5b of the above second embodiment.

The above steps S1e and S2e are set as a first set. When the first set is performed once or more (a predetermined number of times), it is possible to form the non-borazine-based BN film having a predetermined composition and a predetermined film thickness as the first film on the wafer 200. The first set is preferably repeated a plurality of times.

That is, a cycle includes the process of forming the first film in which the first set [steps S1e and S2e] is performed a predetermined number of times and the process of forming the second film of the first embodiment. When this cycle is performed once or more (a predetermined number of times), it is possible to form a laminate film (nanolaminate film) in which the non-borazine-based BN film and the borazine-based BCN film having a predetermined composition and a predetermined film thickness are alternately laminated at a nano level on the wafer 200. The entire laminate film becomes a film that contains boron, carbon and nitrogen and has the borazine ring structure, that is, the borazine-based BCN film.

Figure 8A:
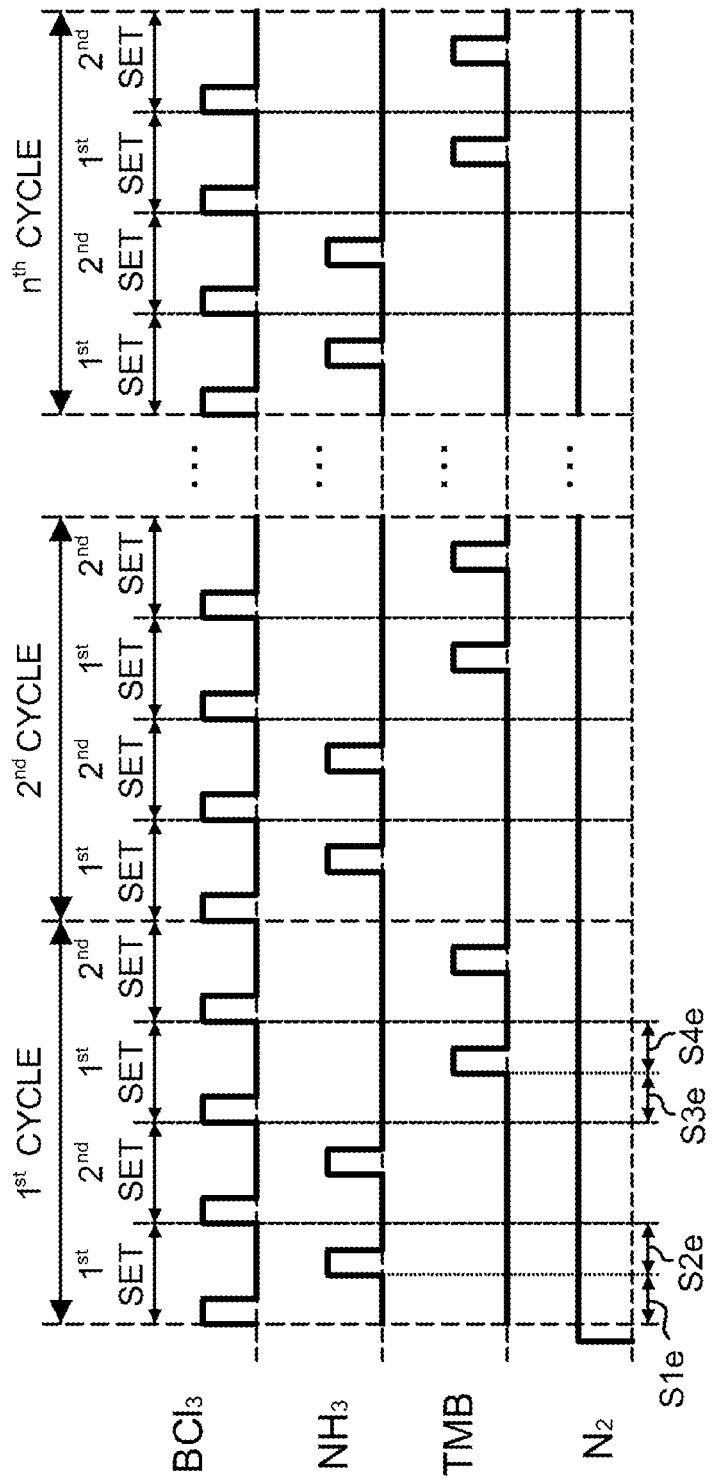
FIGS. 8A and 8B are diagrams illustrating gas supply and high frequency power supply timings in a film formation sequence of a fifth embodiment.

As illustrated in FIG. 8A, when $NH_3$ gas is thermally activated and flows in the process chamber 201 in step S2e, the first layer may be thermally nitrided and modified (changed) to the second layer.

Figure 8B:
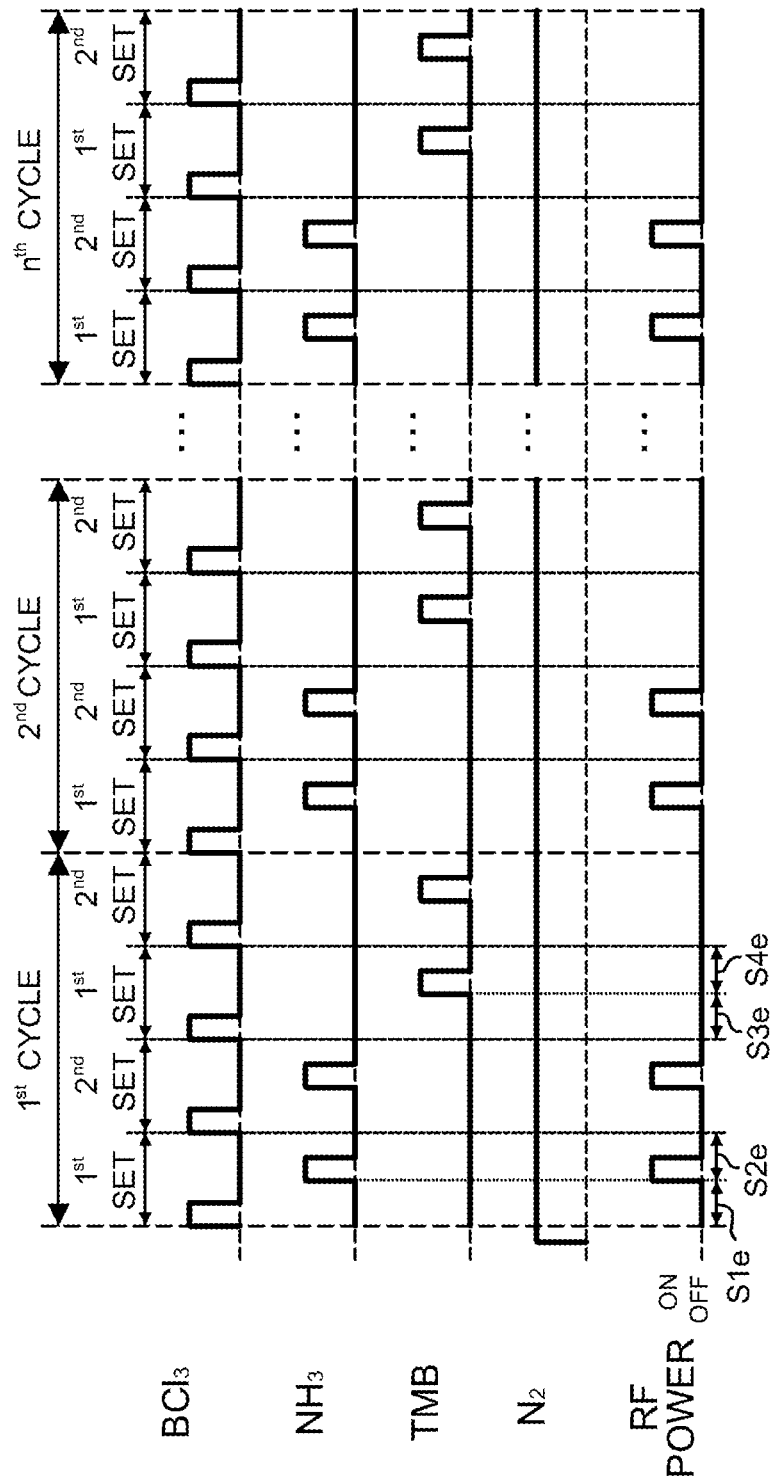

Also, as illustrated in FIG. 8B, when an active species obtained by exciting $NH_3$ gas to plasma in step S2e flows in the process chamber 201, the first layer may be plasma-nitrided and modified (changed) to the second layer.

In this case, the first layer is preferably not saturated with the nitriding reaction. For example, when the first layer having a thickness of less than one atomic layer to several atomic layers is formed in step S1e, a part of the first layer is preferably nitrided. In this case, nitration is performed under a condition in which the first layer is not saturated with the nitriding reaction such that the entire first layer having a thickness of less than one atomic layer to several atomic layers is not nitrided.

As the second process gas, in addition to $NH_3$ gas, another nitriding gas (nitrogen-containing gas) such as $N_2H_2$ gas, $N_2H_4$ gas and $N_3H_8$ gas may be used.

<Other Embodiments of the Present Invention>

Embodiments of the present invention have been specifically described above. However, the present invention is not limited to the above embodiments, but may be variously modified without departing from the scope of the invention.

For example, when the non-borazine-based BCN film is formed on the wafer 200 in the process of forming the first film of the above embodiment, the non-borazine-based BCN film or the non-borazine-based BN film having a predetermined composition and a predetermined film thickness may be formed on the wafer 200 as the first film, by performing a first set a predetermined number of times (for example, a plurality of times). The first set includes performing a set twice or more (a plurality of times), wherein the set includes the process of supplying the chloroborane-based source gas ($BCl_3$) and the process of supplying the amine-based gas (TEA) that are the same as the above steps S1a and S2a, and then performing the process of supplying the nitriding gas ($NH_3$ gas). The present sequence is the same as that of the first embodiment except that steps that are the same as the above steps S1a and S2a are set as a set, this set is repeated a plurality of times and then the process of supplying the nitriding gas is performed. Also, the process conditions in the present sequence may be set as the same process conditions as in the first embodiment. Also, in the process of supplying the nitriding gas, the nitriding gas may be excited to plasma.

According to the present sequence, the same effects as in the first embodiment may be obtained. Also, according to the present sequence, when the process of supplying the nitriding gas is performed, it is possible to finely regulate the composition ratio of the BCN film or the BN film.

Also, for example, when the non-borazine-based BCN film is formed on the wafer in the process of forming the first film of the above embodiment, the process of supplying the carbon-containing gas may be performed to supply the carbon-containing gas to the wafer between the process of supplying chloroborane-based source gas ($BCl_3$) and the process of supplying the amine-based gas (TEA) that are the same as in the above steps S1a and S2a. As the carbon-containing gas, for example, propylene ($C_3H_6$) gas may be used. The process conditions in the present sequence are set as the same process conditions as in the first embodiment.

As the carbon-containing gas, in addition to $C_3H_6$ gas, a hydrocarbon-based gas such as acetylene ($C_2H_2$) gas or ethylene ($C_2H4$) gas may be used. The carbon-containing gas serves as a carbon source. When the hydrocarbon-based gas having no nitrogen is used as the carbon-containing gas, it is possible to easily perform control such that an increase in the nitrogen component in the BCN film is suppressed and the ratio of the carbon component increases.

According to the present sequence, the same effects as in the first embodiment may be obtained. Also, according to the present sequence, when the process of supplying TEA gas and the process of supplying $C_3H_6$ gas are performed, that is, when film formation is performed using two types of carbon sources (double carbon source) during a set, it is possible to add the carbon component included in $C_3H_6$ gas in to the BCN film, in addition to the carbon component included in TEA gas. That is, compared to a case in which one type of carbon source (single carbon source) is used for film formation during a set, it is possible to increase the carbon concentration of the BCN film.

Also, the above-described sequence has exemplified the case in which the process of supplying $C_3H_6$ gas is performed between the process of supplying $BCl_3$ gas and the process of supplying TEA gas, but the present invention is not limited thereto, and the process of supplying $BCl_3$ gas and the process of supplying $C_3H_6$ gas may be simultaneously performed. Also, the process of supplying TEA gas and the process of supplying $C_3H_6$ gas may be simultaneously performed. That is, during a supply stop period of $BCl_3$ gas or TEA gas, $C_3H_6$ gas may be supplied, or during a supply period of $BCl_3$ gas or TEA gas, $C_3H_6$ gas may be supplied. However, since a gas-phase reaction of $BCl_3$ gas and $C_3H_6$ gas in the process chamber 201 may be prevented, that is, since it is possible to prevent particles from being generated in the process chamber 201, simultaneously performing the process of supplying TEA gas and the process of supplying $C_3H_6$ gas is more preferable than simultaneously performing the process of supplying $BCl_3$ gas and the process of supplying $C_3H_6$ gas.

Also, for example, when the borazine-based BCN film is formed on the wafer in the process of forming the second film of the above embodiment, the borazine-based BCN film or the borazine-based BN film having a predetermined composition and a predetermined film thickness may be formed on the wafer 200 as the second film, by performing a second set a predetermined number of times (for example, a plurality of times). The second set includes performing a set twice or more (a plurality of times), wherein the set includes the process of supplying the chloroborane-based source gas ($BCl_3$) and the process of supplying the organic borazine-based gas (TMB) that are the same as the above steps S3a and S4a, and then performing the process of supplying the nitriding gas ($NH_3$ gas). The present sequence is the same as that of the first embodiment except that steps that are the same as the above steps S3a and S4a are set as a set, this set is repeated a plurality of times and then the process of supplying the nitriding gas is performed. Also, the process conditions in the present sequence may be set as the same process conditions as in the first embodiment. Also, in the process of supplying the nitriding gas, the nitriding gas may be excited to plasma.

According to the present sequence, the same effects as in the first embodiment may be obtained. Also, according to the present sequence, when the process of supplying the nitriding gas is performed, it is possible to finely regulate the composition ratio of the BCN film or the BN film.

Also, for example, when the borazine-based BCN film is formed on the wafer in the process of forming the second film of the above embodiment, the process of supplying the carbon-containing gas ($C_3H_6$ gas) may be performed between the process of supplying the chloroborane-based source gas ($BCl_3$) and the process of supplying the organic borazine-based gas (TMB) that are the same as in the above steps S3a and S4a. As the carbon-containing gas, for example, $C_3H_6$ gas may be used. The process conditions in the present sequence are set as the same process conditions as in the first embodiment.

As the carbon-containing gas, in addition to $C_3H_6$ gas, a hydrocarbon-based gas such as $C_2H_2$ gas or $C_2H_4$ gas may be used. The carbon-containing gas serves as a carbon source. When the hydrocarbon-based gas having no nitrogen is used as the carbon-containing gas, it is possible to easily perform control such that an increase in the nitrogen component in the BCN film is suppressed and the ratio of the carbon component increases.

According to the present sequence, the same effects as in the first embodiment may be obtained. Also, according to the present sequence, when the process of supplying TMB gas and the process of supplying $C_3H_6$ gas are performed, that is, when film formation is performed using two types of carbon sources (double carbon source) during a set, it is possible to add the carbon component included in $C_3H_6$ gas into the BCN film, in addition to the carbon component included in TMB gas. That is, compared to a case in which one type of carbon source (single carbon source) is used for film formation during a set, it is possible to increase the carbon concentration of the BCN film.

Also, the above-described sequence has exemplified the case in which the process of supplying $C_3H_6$ gas is performed between the process of supplying $BCl_3$ gas and the process of supplying TMB gas, but the present invention is not limited thereto, and the process of supplying $BCl_3$ gas and the process of supplying $C_3H_6$ gas may be simultaneously performed. Also, the process of supplying TMB gas and the process of supplying $C_3H_6$ gas may be simultaneously performed. That is, during a supply stop period of $BCl_3$ gas or TMB gas, $C_3H_6$ gas may be supplied, or during a supply period of $BCl_3$ gas or TMB gas, $C_3H_6$ gas may be supplied. However, since a gas-phase reaction of $BCl_3$ gas and $C_3H_6$ gas in the process chamber 201 may be prevented, that is, since it is possible to prevent particles from being generated in the process chamber 201, simultaneously performing the process of supplying TMB gas and the process of supplying $C_3H_6$ gas is more preferable than simultaneously performing the process of supplying $BCl_3$ gas and the process of supplying $C_3H_6$ gas.

Also, for example, the borazine-based BCN film having a predetermined composition and a predetermined film thickness may be formed on the wafer 200 as the second film by performing a second set a predetermined number of times (for example, a plurality of times). The second set includes performing a set twice or more (a plurality of times), wherein the set includes steps S3c and S4c in the process of forming the second film of the above third embodiment and then performing step S5c. Also, the present sequence is the same as that of the third embodiment except that the above steps S3c and S4c is set as a set, this set is repeated a plurality of times, and then step S5c is performed. Also, the process conditions in the present sequence may be set as the same process conditions as in the above third embodiment.

According to the present sequence, the same effects as in the above third embodiment may be obtained. Also, according to the present sequence, when step S5c is performed and nitrogen and carbon included in TEA gas are added into the fourth layer, it is possible to form the BCN film in which the nitrogen component and the carbon component increase. Also, when TEA gas is not excited to plasma, but is thermally activated and then supplied, a desorption (extraction) operation of the carbon component from the fourth layer may be relatively mitigated, and a ratio of the carbon component of the BCN film may be easily controlled to be increased.

Also, the present sequence is not limited to the order of steps S3c, S4c and S5c, but may be performed in the order of steps S3c, S5c and S4c.

When step S5c is performed after step S3c, the third layer formed in step S3c reacts with TEA gas. Therefore, the third layer is changed (modified) to the non-borazine-based BCN layer. The BCN layer becomes, for example, a layer having a thickness of less than one atomic layer to several atomic layers. Also, the BCN layer becomes a layer having a relatively high boron component ratio and carbon component ratio, that is, a boron-rich and carbon-rich layer.

Also, when step S4c is performed after step S5c, the non-borazine-based BCN layer formed in step S5c reacts with TMB gas. Therefore, the non-borazine-based BCN layer is changed (modified) to the fifth layer that has the borazine ring structure and contains boron, carbon and nitrogen, that is, the borazine-based BCN layer.

Therefore, the borazine-based BCN film having a predetermined composition and a predetermined film thickness may be formed on the wafer 200 as the second film, by performing a second set a predetermined number of times, wherein the second set is a set in which steps S3c, S5c and S4c are sequentially performed, or by performing a second set a predetermined number of times, wherein the second set includes repeating a set of steps S3c and S5c a plurality of times and then performing step S4c.

Also, for example, in the process of forming the second film of the above embodiment, as the third process gas, instead of $BCl_3$ gas, a halogenated boron-based gas (haloborane-based gas) other than $BCl_3$ gas, for example, a chloroborane-based gas other than $BCl_3$ gas or a fluoroborane-based gas such as borontrifluoride gas ($BF_3$ gas), or a bromoborane-based gas such as boron tribromide gas ($BBr_3$ gas) may be used. Also, a borane-based gas such as diborane ($B_2H_6$) gas may be used. Also, in addition to an inorganic borane-based gas, an organic borane-based gas may be used. Also, instead of the borane-based gas, the nitriding gas or the amine-based gas may be used.

That is, as the third process gas, at least one of a gas free of the borazine ring structure and including boron such as the borane-based gas, a gas containing nitrogen such as the nitriding gas and a gas containing nitrogen and carbon such as the amine-based gas may be used. Also, when the nitriding gas is used as the third process gas, it is possible to desorb carbon from the layer due to nitration, and the borazine-based BCN film or the borazine-based BN film is formed as the second film. Also, in these cases, steps S3c and S4c may be sequentially performed or steps S4c and S3c may be sequentially performed.

In the film formation sequence of the above other embodiments, the same effects as in the film formation sequence of the first to fifth embodiments may be obtained, and controllability of composition ratio control may increase (the composition ratio may be finely regulated).

When the BCN film or the BN film formed by a technique of each of the above embodiments or each of the modifications is used as a sidewall spacer, it is possible to provide device forming technology having a low leakage current and excellent processability.

Also, when the BCN film or the BN film formed by a technique of each of the above embodiments or each of the modifications is used as a hard mask or an etch stopper layer, it is possible to provide device forming technology having excellent processability.

According to some of the above embodiments or some modifications, the BCN film or the BN film having an ideal stoichiometric ratio may be formed in a low temperature range without plasma. Also, since the BCN film or the BN film may be formed without plasma, adaptation to a process in which plasma damage is a concern, for example, an SADP film of DPT, may be possible.

A process recipe (a program in which process sequences or process conditions are described) used in the formation of the above thin film may preferably be separately prepared (prepared in a plurality of recipes) according to content (a film type, a composition ratio, film quality, a film thickness, a process sequence, a process condition and the like of a thin film to be formed) of substrate processing. Then, when the substrate processing starts, an appropriate process recipe is preferably appropriately selected from among the plurality of process recipes according to content of the substrate processing. Specifically, the plurality of process recipes separately prepared according to content of the substrate processing are preferably stored (installed) in advance in the memory device 121c provided in the substrate processing apparatus through telecommunication lines or the non-transitory computer-readable recording medium [the external memory device 123] recording the process recipe. Then, when the substrate processing starts, the CPU 121a provided in the substrate processing apparatus preferably appropriately selects an appropriate process recipe according to content of the substrate processing from among the plurality of process recipes stored in the memory device 121c. In such a configuration, it is possible to generally and repeatedly form the thin film having various film types, composition ratios, film qualities, and film thicknesses in the single substrate processing apparatus. In addition, it is possible to decrease an operation load (such as a load for inputting processing sequences or processing conditions) of an operator, thereby preventing operation errors and quickly starting the substrate processing.

In addition to creating a new process recipe, the above-described process recipe may be prepared by, for example, changing an existing process recipe that is previously installed in the substrate processing apparatus. When the process recipe is changed, the changed process recipe may be installed in the substrate processing apparatus through the telecommunication lines or the non-transitory computer-readable recording medium recording the process recipe. Also, by manipulating the I/O device 122 provided in the existing substrate processing apparatus, the existing process recipe that is previously installed in the substrate processing apparatus may be directly changed.

In the above embodiment, the example in which the thin film is formed using the batch-type substrate processing apparatus that processes the plurality of substrates at once has been described. However, the present invention is not limited to the above embodiment, but may be preferably applied, for example, when the thin film is formed using a single substrate processing apparatus that processes one or several substrates at once. In addition, in the above embodiment, the example in which the thin film is formed using the substrate processing apparatus including a hot wall-type processing furnace has been described. However, the present invention is not limited to the above embodiment, but may be preferably applied when the thin film is formed using a substrate processing apparatus including a cold wall-type processing furnace.

The above embodiments, modifications, applications and the like may be appropriately combined and used.

According to the present invention, it is possible to form a thin film having a high oxidation resistance and a low dielectric constant.

What is claimed is:

1. A method of manufacturing a semiconductor device, comprising forming a laminated film where a first film and a second film are laminated on a substrate by performing a cycle a predetermined number of times under a condition where a borazine ring structure in a fourth process gas is maintained, the cycle comprising:

(a) forming a film free of the borazine ring structure and including boron and nitrogen or a film free of the borazine ring structure and including boron, carbon and nitrogen as the first film by performing a first set a predetermined number of times, wherein the first set comprises: supplying a first process gas free of the borazine ring structure and including boron to the substrate and supplying a second process gas including nitrogen or including nitrogen and carbon to the substrate; and (b) forming a film having the borazine ring structure and including boron and nitrogen or a film having the borazine ring structure and including boron, carbon and nitrogen as the second film by performing a second set a predetermined number of times, wherein the second set comprises: supplying a third process gas to the substrate and supplying the fourth process gas having the borazine ring structure and an organic ligand to the substrate.

2. The method of claim 1, wherein the first film is formed before the second film is formed in forming the laminated film.

3. The method of claim 1, wherein an initial film formed in forming the laminated film is the first film.

4. The method of claim 3, wherein a last film formed in forming the laminated film is the first film.

5. The method of claim 1, wherein a last film formed in forming the laminated film is the first film.

6. The method of claim 1, wherein (a) and (b) are alternately performed a plurality of times in forming the laminated film.

7. The method of claim 1, wherein a thickness of each of the first film and the second film is equal to or less than 5 nm.

8. The method of claim 1, wherein a thickness of each of the first film and the second film is equal to or less than 1 nm.

9. The method of claim 1, wherein the laminated film comprises a nano-laminated film where the first film and the second film are laminated at nano-level.

10. The method of claim 1, wherein the third process gas comprises at least one selected from the group consisting of a gas free of the borazine ring structure and including boron, a gas including nitrogen and a gas including nitrogen and carbon.

11. The method of claim 1, wherein the third gas comprises a gas having a same chemical structure as that of one of the first gas or the second gas.

12. The method of claim 1, wherein the third gas comprises a gas having a same chemical structure as that of the first gas.

13. The method of claim 1, wherein each of the first gas and the third gas comprises a gas free of the borazine ring structure and including boron and a halogen element.

* * * * *